United States Patent
Shin et al.

(10) Patent No.: US 12,305,307 B2
(45) Date of Patent: May 20, 2025

(54) TSV PROCESS WINDOW AND FILL PERFORMANCE ENHANCEMENT BY LONG PULSING AND RAMPING

(71) Applicant: Lam Research Corporation, Fremont, CA (US)

(72) Inventors: Jae Shin, Beaverton, OR (US); Joseph Richardson, Sherwood, OR (US); Jeyavel Velmurugan, Portland, OR (US); Thomas Anand Ponnuswamy, Sherwood, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 125 days.

(21) Appl. No.: 17/758,496

(22) PCT Filed: Jan. 8, 2021

(86) PCT No.: PCT/US2021/012822
§ 371 (c)(1),
(2) Date: Jul. 7, 2022

(87) PCT Pub. No.: WO2021/142357
PCT Pub. Date: Jul. 15, 2021

(65) Prior Publication Data
US 2023/0026818 A1    Jan. 26, 2023

Related U.S. Application Data

(60) Provisional application No. 62/959,817, filed on Jan. 10, 2020.

(51) Int. Cl.
*C25D 5/18* (2006.01)
*C25D 3/38* (2006.01)
(Continued)

(52) U.S. Cl.
CPC ............... *C25D 5/18* (2013.01); *C25D 3/38* (2013.01); *C25D 5/02* (2013.01); *C25D 7/123* (2013.01);
(Continued)

(58) Field of Classification Search
CPC .. C25D 5/18; C25D 7/12–123; C25D 17/001; H01L 21/2885; H01L 21/76873; H01L 2224/11462
See application file for complete search history.

(56) References Cited

U.S. PATENT DOCUMENTS 3,362,851 A    1/1968  Thomas et al.
4,216,272 A    8/1980  Clauss
(Continued)

FOREIGN PATENT DOCUMENTS

CN    1272685 A    11/2000
CN    101004401 A    7/2007
(Continued)

OTHER PUBLICATIONS

KR 10-2007-0031541, Original and Machine Translation (Year: 2007).*
(Continued)

*Primary Examiner* — Hosung Chung
(74) *Attorney, Agent, or Firm* — Weaver Austin Villeneuve & Sampson LLP

(57) ABSTRACT

A method of electroplating metal into features of a partially fabricated electronic device on a substrate having high open area portions is provided. The method includes initiating a bulk electrofill phase with a pulse at a high level of current; reducing the current to a baseline current level; and optionally increasing the current in one or more steps until electroplating is complete.

34 Claims, 11 Drawing Sheets

(51) Int. Cl.
- *C25D 5/02* (2006.01)
- *C25D 7/12* (2006.01)
- *C25D 17/00* (2006.01)
- *C25D 17/08* (2006.01)
- *C25D 21/12* (2006.01)
- *H01L 21/768* (2006.01)

(52) U.S. Cl.
CPC ........... *C25D 17/001* (2013.01); *C25D 17/08* (2013.01); *C25D 21/12* (2013.01); *H01L 21/76898* (2013.01)

(56) References Cited

U.S. PATENT DOCUMENTS

| | | | |
|---|---|---|---|
| 4,301,196 | A | 11/1981 | McCormack et al. |
| 4,461,680 | A | 7/1984 | Lashmore |
| 4,519,878 | A | 5/1985 | Hara et al. |
| 5,051,154 | A | 9/1991 | Bernards et al. |
| 5,100,714 | A | 3/1992 | Zsamboky |
| 5,252,196 | A | 10/1993 | Sonnenberg et al. |
| 5,281,485 | A | 1/1994 | Colgan et al. |
| 5,328,589 | A | 7/1994 | Martin |
| 5,549,808 | A | 8/1996 | Farooq et al. |
| 5,985,106 | A | 11/1999 | Velasquez |
| 6,126,798 | A | 10/2000 | Reid et al. |
| 6,156,167 | A | 12/2000 | Patton et al. |
| 6,183,888 | B1 | 2/2001 | Alperine et al. |
| 6,193,858 | B1 | 2/2001 | Hradil et al. |
| 6,297,157 | B1 | 10/2001 | Lopatin et al. |
| 6,309,528 | B1 | 10/2001 | Taylor et al. |
| 6,562,204 | B1 | 5/2003 | Mayer et al. |
| 6,569,299 | B1 | 5/2003 | Reid et al. |
| 6,592,737 | B1 | 7/2003 | Robertson |
| 6,652,731 | B2 | 11/2003 | Cobley et al. |
| 6,746,591 | B2 | 6/2004 | Zheng et al. |
| 6,800,187 | B1 | 10/2004 | Reid et al. |
| 6,884,332 | B2 | 4/2005 | Forth et al. |
| 6,911,136 | B2 | 6/2005 | Zheng et al. |
| 6,913,680 | B1 | 7/2005 | Zheng et al. |
| 6,946,065 | B1 | 9/2005 | Mayer et al. |
| 7,064,068 | B2 | 6/2006 | Chou et al. |
| 7,189,647 | B2 | 3/2007 | Patton et al. |
| 7,449,098 | B1 | 11/2008 | Mayer et al. |
| 7,879,218 | B1 | 2/2011 | Webb et al. |
| 8,003,527 | B2 | 8/2011 | Sunayama et al. |
| 8,197,662 | B1 | 6/2012 | Webb et al. |
| 8,500,983 | B2 | 8/2013 | Ponnuswamy et al. |
| 8,808,521 | B2 | 8/2014 | Zhou |
| 8,962,085 | B2 | 2/2015 | Mayer et al. |
| 9,257,401 | B2 | 2/2016 | Hsu et al. |
| 9,309,604 | B2 | 4/2016 | Mayer et al. |
| 9,309,605 | B2 | 4/2016 | Mayer |
| 9,385,035 | B2 | 7/2016 | Spurlin et al. |
| 9,455,139 | B2 | 9/2016 | Buckalew et al. |
| 9,523,155 | B2 | 12/2016 | Mayer et al. |
| 9,856,574 | B2 | 1/2018 | Mayer |
| 9,870,995 | B2 | 1/2018 | Nian et al. |
| 10,094,034 | B2 | 10/2018 | Graham et al. |
| 10,094,035 | B1 | 10/2018 | Graham et al. |
| 10,233,556 | B2 | 3/2019 | Graham et al. |
| 10,364,505 | B2 | 7/2019 | Thorkelsson et al. |
| 10,692,735 | B2 | 6/2020 | Thorkelsson et al. |
| 2001/0014409 | A1 | 8/2001 | Cohen |
| 2001/0015321 | A1 | 8/2001 | Reid et al. |
| 2002/0033341 | A1 | 3/2002 | Taylor et al. |
| 2003/0070934 | A1 | 4/2003 | Cobley et al. |
| 2003/0089986 | A1 | 5/2003 | Gilkes et al. |
| 2003/0102223 | A1 | 6/2003 | Shimo et al. |
| 2003/0116439 | A1 | 6/2003 | Seo et al. |
| 2003/0119311 | A1 | 6/2003 | Basol et al. |
| 2003/0183527 | A1 | 10/2003 | Collins |
| 2004/0016637 | A1 | 1/2004 | Yang et al. |
| 2004/0170753 | A1 | 9/2004 | Basol |
| 2004/0265562 | A1 | 12/2004 | Uzoh et al. |
| 2005/0045485 | A1 | 3/2005 | Shih et al. |
| 2005/0183959 | A1 | 8/2005 | Wilson et al. |
| 2005/0274622 | A1* | 12/2005 | Sun ............... C25D 5/34 205/291 |
| 2006/0105565 | A1 | 5/2006 | Liu et al. |
| 2006/0154084 | A1 | 7/2006 | Schuh et al. |
| 2006/0223313 | A1 | 10/2006 | Yoon et al. |
| 2006/0243597 | A1 | 11/2006 | Matefi-Tempfli et al. |
| 2006/0252254 | A1 | 11/2006 | Basol |
| 2007/0261963 | A1 | 11/2007 | Han et al. |
| 2008/0057211 | A1 | 3/2008 | Chen et al. |
| 2009/0038950 | A1 | 2/2009 | Zhang-Beglinger et al. |
| 2009/0139873 | A1 | 6/2009 | Wang et al. |
| 2009/0162685 | A1 | 6/2009 | Kobayashi et al. |
| 2010/0126872 | A1 | 5/2010 | Paneccasio, Jr. et al. |
| 2010/0276292 | A1 | 11/2010 | Webb et al. |
| 2010/0300888 | A1 | 12/2010 | Ponnuswamy et al. |
| 2011/0076390 | A1 | 3/2011 | Cerio, Jr. et al. |
| 2011/0096138 | A1 | 4/2011 | Grimshaw |
| 2011/0284386 | A1 | 11/2011 | Willey et al. |
| 2012/0090987 | A1 | 4/2012 | Gorer et al. |
| 2012/0193238 | A1 | 8/2012 | Park et al. |
| 2013/0161203 | A1 | 6/2013 | Mayer |
| 2013/0244423 | A1 | 9/2013 | Kolics |
| 2013/0264213 | A1 | 10/2013 | Roeger-Goepfert et al. |
| 2013/0313123 | A1 | 11/2013 | Abraham et al. |
| 2013/0313124 | A1* | 11/2013 | Macneil ............ C25D 17/02 204/198 |
| 2014/0120722 | A1* | 5/2014 | Richardson ....... H01L 21/76879 438/675 |
| 2014/0138142 | A1 | 5/2014 | Hu et al. |
| 2014/0224661 | A1 | 8/2014 | Spurlin et al. |
| 2014/0238868 | A1* | 8/2014 | Li .................. C25D 3/38 205/296 |
| 2014/0367279 | A1 | 12/2014 | Brogan et al. |
| 2015/0122661 | A1 | 5/2015 | Woertink et al. |
| 2015/0225866 | A1 | 8/2015 | Lee et al. |
| 2015/0303065 | A1 | 10/2015 | Buckalew et al. |
| 2016/0155685 | A1 | 6/2016 | Chen et al. |
| 2016/0258078 | A1 | 9/2016 | Thorum et al. |
| 2016/0265132 | A1 | 9/2016 | Graham et al. |
| 2017/0058417 | A1 | 3/2017 | Graham et al. |
| 2017/0342583 | A1 | 11/2017 | Thorkelsson et al. |
| 2017/0372952 | A1* | 12/2017 | Birner ............... H01L 23/5226 |
| 2018/0010258 | A1* | 1/2018 | Fujiwara ............ C25D 21/12 |
| 2018/0258546 | A1 | 9/2018 | Graham et al. |
| 2019/0035640 | A1 | 1/2019 | Thorkelsson et al. |
| 2019/0122890 | A1 | 4/2019 | Thorkelsson et al. |
| 2022/0275531 | A1 | 9/2022 | Banik et al. |

FOREIGN PATENT DOCUMENTS

| | | |
|---|---|---|
| JP | 2006225715 A | 8/2006 |
| JP | 2015001523 A | 1/2015 |
| KR | 20010014062 A | 2/2001 |
| KR | 20020060716 A | 7/2002 |
| KR | 20120029468 A | 3/2012 |
| KR | 20150078138 A | 7/2015 |
| TW | 201131023 A | 9/2011 |
| TW | 201827654 A | 8/2018 |
| WO | WO-2013090295 A1 | 6/2013 |

OTHER PUBLICATIONS

Chang et al. "Investigations of effects of bias polarization and chemical parameters on morphology and filling capability of 130 nm damascene electroplated copper", J. Vac. Sci. Technol. B 19(3), 2001. (Year: 2001), 8 pages.

CN Office Action dated Dec. 18, 2023 in CN Application No. 202080067446, with English Translation.

CN Office Action dated Jul. 1, 2024 in CN Application No. 201880068336.8 with English translation.

CN Office Action dated Jul. 4, 2024 in CN Application No. 202080067446.X with English translation.

International Preliminary Report on Patentability and written opinion dated Jul. 21, 2022 in Application PCT/US2021/012822.

(56) References Cited

OTHER PUBLICATIONS

International Search Report and Written Opinion of the Searching Authority, dated Nov. 5, 2020, for International Patent Application No. PCT/US2020/070303.
International Preliminary Report on Patentability dated Feb. 10, 2022 issued in Application No. PCT/US2020/070303.
International Preliminary Report on Patentability issued on Apr. 30, 2020 in PCT Application No. PCT/US2018/055916, 8 pages.
International Search Report and Written Opinion dated May 10, 2021 in PCT Application No. PCT/US2021/012822.
International Search Report and Written Opinion issued on Feb. 1, 2019 in Application No. PCT/US2018/055916, 10 pages.
KR Office Action dated Aug. 26, 2024 in KR Application No. 10-2020-7014241, with English Translation.
Li et al. "Through Silicon Via Filling by Copper Electroplating in Acidic Cupric Methanesulfonate Bath", 2009 International Conference on Electronic Packaging Technology & High Density Packaging. (Year: 2009), 5 pages.
Richardson, T.B., "Challenges facing electrochemical deposition in wafer level packaging", May 2016. (Year: 2016), 34 pages.
"Rightscale 2019 State of the Cloud Report" Flexera, 2019.
TW Office Action dated Jul. 8, 2022, in Application No. TW107136267 with English translation.
U.S. Final Office Action dated Jan. 3, 2022 in U.S. Appl. No. 16/165,886.
U.S. Final Office Action dated Jan. 11, 2021, in U.S. Appl. No. 16/165,886.
U.S. Non-Final Office Action dated Apr. 30, 2024 in U.S. Appl. No. 17/597,775.
U.S. Non-Final office Action dated Jul. 24, 2020, in U.S. Appl. No. 16/165,886.
U.S. Non-Final office Action dated Jun. 28, 2021, in U.S. Appl. No. 16/165,886.
CN Office Action dated Dec. 3, 2014 in CN Application No. 201080023223.X, with English Translation.
CN Office Action dated Dec. 4, 2013 in CN Application No. 201080023223.X, with English Translation.
CN Office Action dated Jul. 7, 2014 in CN Application No. 201080023223.X, with English Translation.
CN Office Action dated May 25, 2015 in CN Application No. 201080023223.X, with English Translation.
English translation of KR Office Action dated May 12, 2012 in KR Application No. KR 10-2011-7031103.
International Preliminary Report on Patentability and Written Opinion dated Dec. 8, 2011 in PCT Application No. PCT/US2010/035991.
International Search Report and Written Opinion dated Dec. 23, 2010 in PCT Application No. PCT/US2010/035991.
KR Notice of Allowances dated May 22, 2020 in KR Application No. 10-2014-0002076 with English Translation.
KR Notice of Allowances dated Oct. 26, 2020 in KR Application No. 10-2020-0104658 with English Translation.
KR Office Action dated Apr. 30, 2012 in KR Application No. 10-2011-7031103 with English Translation.
TW Office Action dated Apr. 9, 2014 in TW Application No. TW99117062, with English Translation.
TW Office Action dated Dec. 18, 2012 in TW Application No. TW99117062, with English Translation.
TW Office Action dated Jun. 24, 2013 in TW Application No. TW99117062, with English Translation.
U.S. Final Office Action dated Feb. 25, 2013 in U.S. Appl. No. 12/786,329.
U.S. Non-Final Office Action dated Apr. 18, 2012 in U.S. Appl. No. 12/786,329.
U.S. Notice of Allowance dated Apr. 26, 2013 in U.S. Appl. No. 12/786,329.
U.S. Notice of Allowance dated Mar. 10, 2016 issued in U.S. Appl. No. 13/987,311.
U.S. Office Action dated Oct. 9, 2015 issued in U.S. Appl. No. 13/987,311.
U.S. Restriction requirement dated Jul. 9, 2015 in U.S. Appl. No. 13/987,311.
U.S. Restriction requirement dated Nov. 14, 2011 in U.S. Appl. No. 12/786,329.
CN Office Action dated Dec. 13, 2024 in CN Application No. 201880068336.8, with English Translation.
KR Notice of Allowance dated Dec. 26, 2024 in KR Application No. 10-2020-7014241, with English Translation.
U.S. Final Office Action dated Nov. 26, 2024 in U.S. Appl. No. 17/597,775.

\* cited by examiner

ND FILL
TSV PROCESS WINDOW AND FILL PERFORMANCE ENHANCEMENT BY LONG PULSING AND RAMPING

INCORPORATED BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

A through silicon via (TSV) is a vertical electrical connection passing completely through a silicon wafer or die. TSV technology may be used to create 3D packages and 3D integrated circuits (IC). It provides interconnection of vertically aligned electronic devices through internal wiring that significantly reduces complexity and overall dimensions of a multi-chip electronic circuit.

A typical TSV process involves forming TSV holes and depositing conformal diffusion barrier and conductive seed layers, followed by filling of TSV holes with a metal. Copper is typically used as the conductive metal in TSV fill as it supports high current densities experienced at complex integration, such as 3D packages and 3D integrated circuits, and increased device speed. Furthermore, copper has good thermal conductivity and is available in a highly pure state.

TSV holes typically have high aspect ratios which makes void-free deposition of copper into such structures a challenging task. CVD deposition of copper requires complex and expensive precursors, while PVD deposition often results in voids and limited step coverage. Electroplating is a more common method of depositing copper into TSV structures; however, electroplating also presents a set of challenges because of the TSV's large size and high aspect ratio.

In a typical TSV electrofilling process, the substrate is negatively electrically biased and is contacted with a plating solution which may include copper sulfate as a source of copper ions, sulfuric acid for controlling conductivity, and several organic additives known as suppressors, accelerators and levelers. Conformal filling which includes deposition of substantial amounts of copper on the TSV sidewalls, can result in seam voids.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Disclosed herein are methods and systems for electroplating metal using a current waveform having a pulse. In one aspect of the embodiments disclosed herein, a method of electroplating metal is disclosed, the method including: contacting a substrate with an electroplating solution having metal ions, where the substrate has features providing an open area of at least about 0-9% on a face of the substrate; applying an electrofill current waveform to the substrate contacting the electroplating solution, where the electrofill current waveform includes (i) a pulse having a magnitude of at least about 2 times a magnitude of a baseline current for a duration of from about 10 to about 200 seconds, and (ii) a substantially constant current step having, on average, the magnitude of the baseline current, where the substantially constant current step follows the pulse; and filling at least a portion of the features with the metal.

In some implementations, the pulse of the electrofill current waveform may include an initial step change that increases the magnitude of current applied to the substrate, followed by a ramp that decreases the magnitude of current applied to the substrate. In some implementations, the duration of the ramp may be at least 10 seconds. In some implementations, the ramp may be a linear change between the magnitude of the pulse current and the magnitude of the baseline current. In some implementations, the electrofill current waveform may further include (iii) a second substantially constant current step having, on average, a magnitude that may be greater than the magnitude of the baseline current. In some implementations, the electrofill current waveform may further include (iv) one or more additional substantially constant current steps, each having, on average, a magnitude that may be greater than the magnitude of the baseline current. In some implementations, the electrofill current waveform may further include an induction phase preceding the pulse, where during the induction phase no current may be applied to the substrate or an induction phase current may be applied to the substrate, where the induction phase current has an average magnitude of between about 30 mA and 200 mA. In some implementations, when applied to the substrate, the baseline current produces a current density of between about 0.01 and 10 mA/cm2 on the substrate. In some implementations, the substrate may be a semiconductor wafer having integrated circuits at least partially fabricated thereon.

In some implementations, the substrate may be a 300 mm semiconductor wafer. In some implementations, the features on the substrate are through silicon vias. In some implementations, the through silicon vias have, on average, an opening width or diameter on the substrate face of at least about 0.1 micrometers. In some implementations, the through silicon vias have, on average, a depth of at least about 10 micrometers. In some implementations, the through silicon vias have, on average, an aspect ratio of about 4 or greater. In some implementations, the metal may be copper. In some implementations, the electroplating solution includes a source of cupric ions. In some implementations, the electroplating solution does not contain a source of cuprous ions. In some implementations, the electroplating solution has a pH of about 0 to 1. In some implementations, the electroplating solution includes an accelerator and a suppressor. In some implementations, the accelerator may be SPS. In some implementations, the change in the electrofill current waveform from the pulse to the baseline current may be substantially immediate.

In another aspect of the embodiments disclosed herein, a method of electroplating metal includes: contacting a substrate with an electroplating solution having metal ions, where the substrate has features; applying an electrofill current waveform to the substrate contacting the electroplating solution, where the electrofill current waveform includes (i) a pulse having a magnitude of at least about 2 times a magnitude of a baseline current for a duration of from about 10 to about 200 seconds, and (ii) a substantially constant current step having, on average, the magnitude of the baseline current, where the substantially constant current step follows the pulse; and filling at least a portion of the features with the metal.

In another aspect of the embodiments disclosed herein, an electroplating system is disclosed, the system including: an electroplating cell configured to contain an anode and an electroplating solution having ions of a metal; a wafer holder configured to support a substrate within the electroplating cell; and one or more controllers configured to cause: contacting the substrate with the electroplating solution having metal ions, wherein the substrate has features; applying an electrofill current waveform to the substrate contacting the electroplating solution, wherein the electrofill current waveform comprises (i) a pulse having a magnitude of at least about 2 times a magnitude of a baseline current for a duration of from about 10 to about 200 seconds, and (ii) a substantially constant current step having, on average, the magnitude of the baseline current, wherein the substantially constant current step follows the pulse; and filling at least a portion of the features with the metal.

In some implementations, the pulse of the electrofill current waveform may include an initial step change that increases the magnitude of current applied to the substrate, followed by a ramp that decreases the magnitude of current applied to the substrate. In some implementations, the duration of the ramp may be at least 10 seconds. In some implementations, the ramp may be a linear change between the magnitude of the pulse current and the magnitude of the baseline current. In some implementations, the electrofill current waveform may further include (iii) a second substantially constant current step having, on average, a magnitude that may be greater than the magnitude of the baseline current. In some implementations, the electrofill current waveform may further include (iv) one or more additional substantially constant current steps, each having, on average, a magnitude that may be greater than the magnitude of the baseline current. In some implementations, the electrofill current waveform may further include an induction phase preceding the pulse, where during the induction phase no current may be applied to the substrate or an induction phase current may be applied to the substrate, where the induction phase current has an average magnitude of between about 30 mA and 200 mA. In some implementations, when applied to the substrate, the baseline current produces a current density of between about 0.01 and 10 mA/cm2 on the substrate. In some implementations, the substrate may be a semiconductor wafer having integrated circuits at least partially fabricated thereon.

In some implementations, the substrate may be a 300 mm semiconductor wafer. In some implementations, the features on the substrate are through silicon vias. In some implementations, the through silicon vias have, on average, an opening width or diameter on the substrate face of at least about 0.1 micrometers. In some implementations, the through silicon vias have, on average, a depth of at least about 10 micrometers. In some implementations, the through silicon vias have, on average, an aspect ratio of about 4 or greater. In some implementations, the metal may be copper. In some implementations, the electroplating solution includes a source of cupric ions. In some implementations, the electroplating solution does not contain a source of cuprous ions. In some implementations, the electroplating solution has a pH of about 0 to 1. In some implementations, the electroplating solution includes an accelerator and a suppressor. In some implementations, the accelerator may be SPS. In some implementations, the change in the electrofill current waveform from the pulse to the baseline current may be substantially immediate.

These and other features of the disclosed embodiments will be described in detail below with reference to the associated drawings.

DETAILED DESCRIPTION

Introduction

Techniques for reducing voids in plated features, such as through-silicon-vias (TSV) or wafer level packaging (WLP), are provided herein. A TSV is a via for an electrical connection passing completely through a semiconductor work piece, such as a silicon wafer or die. In this disclosure, various terms are used to describe a semiconductor work piece. For example, "wafer" and "substrate" are used interchangeably. A typical TSV process involves forming TSV holes and depositing a conformal diffusion barrier and conductive seed layers on a substrate, followed by filling of the TSV holes with a metal. TSV holes typically have high aspect ratios which makes void-free deposition of copper into such structures a challenging task. TSVs typically have aspect ratios of 4:1 and greater, such as 10:1 and greater, and even 20:1 and greater (e.g., reaching about 30:1), with widths at opening of about 0.1 µm or greater, such as about 5 µm or greater, and depths of about 5 µm or greater, such as about 50 µm or greater, and about 100 µm or greater. Examples of TSVs include 5×50 µm and 10×100 µm features. Such large recessed features, when coated with acid-sensitive seed layers are particularly difficult to fill using conventional techniques. Chemical vapor deposition (CVD) of copper requires complex and expensive precursors, while physical vapor deposition (PVD) often results in voids and limited step coverage. The process of depositing, or plating, metal onto a conductive surface via an electrochemical reaction is referred to generally as electroplating, plating, or electrofilling. Electroplating is a more common method of depositing copper into TSV structures; however, electroplating also presents a set of challenges because of the TSV's large size and high aspect ratio.

Figure 1:
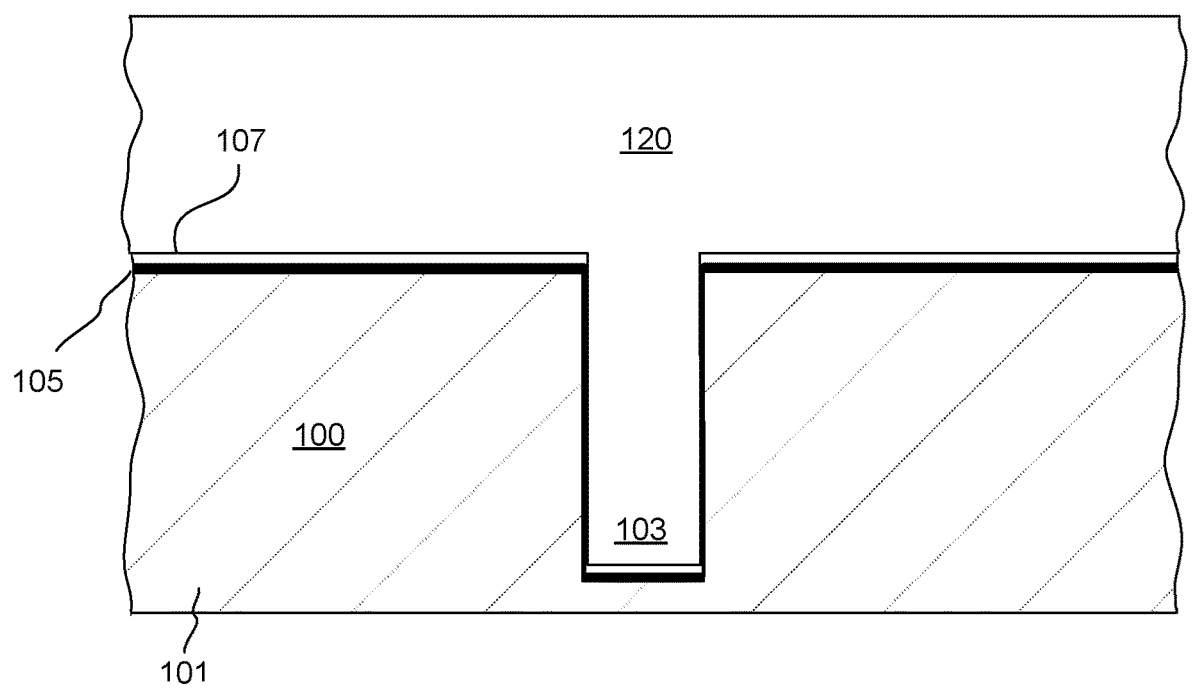
FIG. 1 presents an illustration of filling a recessed feature of a substrate.

FIG. 1 illustrates a distribution of plating solution components when a substrate 100, having a recessed feature or via 103, contacts the plating solution 120. A cross-sectional schematic view of the substrate 100 is shown. The substrate 100 includes a layer of silicon 101, and a via 103 etched into the silicon 101. A dielectric liner (not shown) may be deposited on the silicon 101 in some embodiments. A diffusion barrier layer 105, such as a Ti/TiN, Ta/TaN, or W/WN bi-layer resides on the layer of dielectric. A seed layer 107, such as a cobalt, copper, or nickel seed layer, resides on top of the barrier layer 105, and is exposed to the electroplating solution 120. In some embodiments, a conformal film stack may be present on the substrate. The electroplating solution 120 contains a metal salt, an acid, and additives such as an accelerator, and a suppressor. As shown in FIG. 1, in a typical TSV electrofilling process, a substrate 100 is negatively electrically biased and is contacted with a plating solution 120 in a plating bath which generally includes a metal salt such as copper sulfate or copper methane sulfonate as a source of copper ions, an acid, such as sulfuric acid or methane sulfonic acid for controlling conductivity, along with additives such as chloride ions and organic additives in various functional classes, known as, suppressors, accelerators and levelers.

Damascene processing is a method for forming metal lines on integrated circuits. TSVs are sometimes used in conjunction with Damascene processing to create 3D packages and 3D integrated circuits by providing interconnection of vertically aligned electronic devices through internal wiring. Such 3D packages and 3D integrated circuits may significantly reduce the complexity and overall dimensions of a multi-chip electronic circuit. Conductive routes on the surface of an integrated circuit formed during Damascene processing or in TSVs are commonly filled with copper.

The disclosed methods and apparatus can be used for electroplating a variety of recessed features but are particularly advantageous for filling TSV substrates with a large open area, which is the fraction of the substrate's flat geometric surface area occupied by TSVs.

Figure 2:
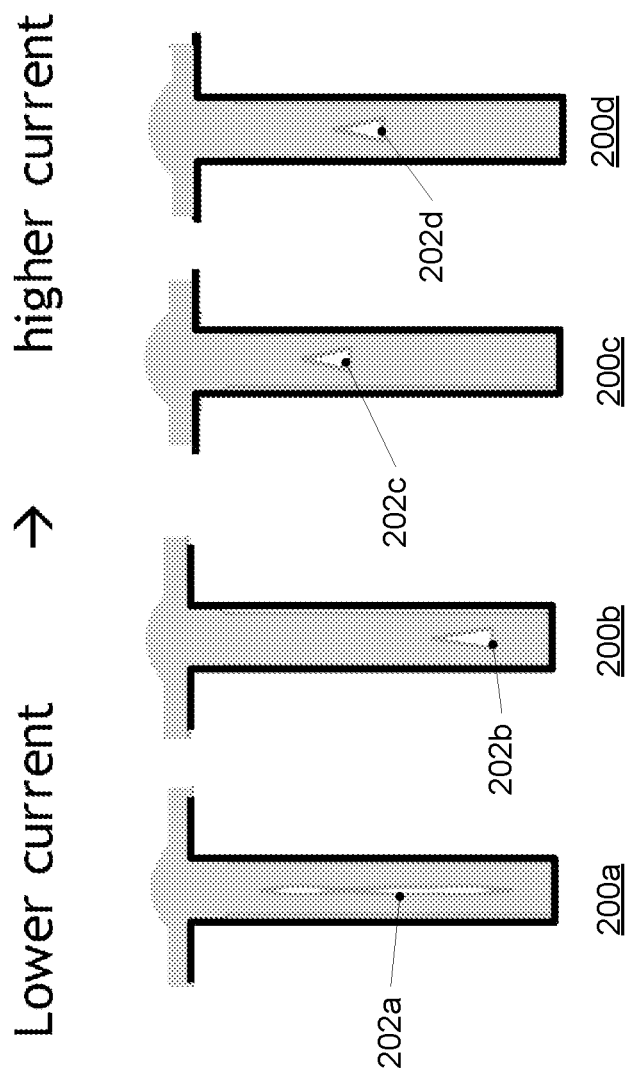
FIG. 2 presents an illustration of voids that may occur at various current levels.

It is desirable to avoid voids when electrofilling features. One way to avoid voids during electrofill is to limit the applied current. Limiting the current below an empirically determined threshold has been found to reduce voids. However, reducing the applied current may not remove voids for wafers that have a high open area as described herein. FIG. 2 shows four different features 200a-d, each of which has a void 202a-d, where the applied current increases from 200a-200d. At high currents, such as features 200c and 200d, there are voids. Usually, lowering current result in a void forming at a higher position, as seen for voids 202c and 202d. However, decreasing the current did not remove the voids, and the void also formed at a lower position for a low enough current, as shown by void 202b. At a low enough current, such as seen in feature 200a, a seam void occurs, rather than a pocket void as seen in features 200b-d. Increasing the current from feature 200a resulted in a pocket void as seen in features 200b. Thus, there seemed to be no current at which electroplating did not incorporate voids.

A solution discovered by the inventors to reduce voids for high open area wafers is to begin the bulk electrofill phase with a pulse of high current. Increasing the current for a brief duration, e.g. between a few seconds and a few minutes, followed by reducing the current to the first bulk electrofill current step, reduces the presence of seam and pocket voids.

Figure 4A:
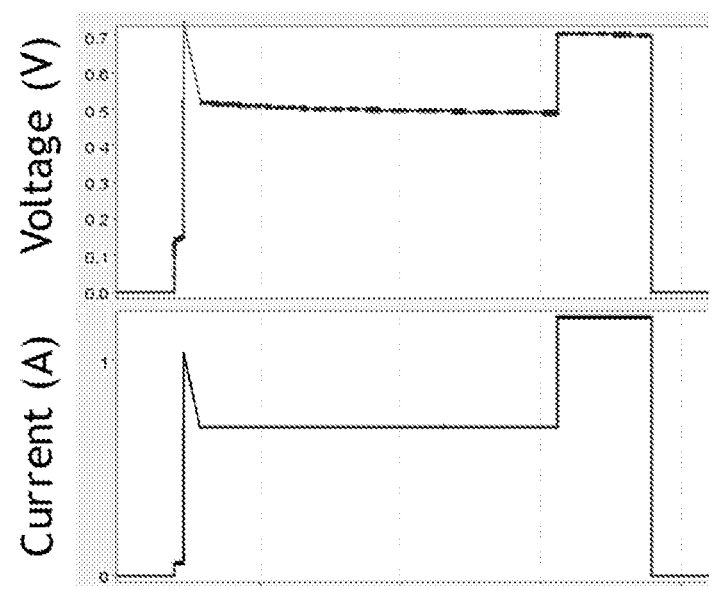
FIGS. 4A and 4B presents examples of current and voltage waveforms according to various embodiments.
Figure 4B:
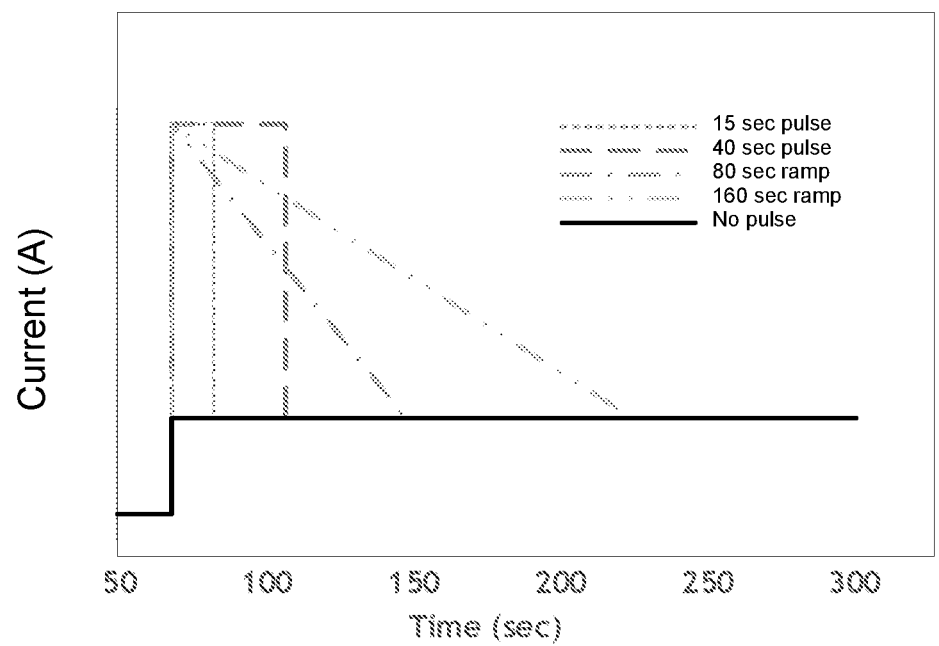

A current waveform describes the current applied throughout the electroplating process. FIG. 4B shows several different current waveforms. The "no pulse" waveform in FIG. 4B illustrates a typical waveform: the current is minimal or zero during an induction phase that is then followed by a step change to a bulk electrofill phase. FIG. 4B shows only a single step change in the bulk electrofill phase, but there may be multiple step changes within the bulk electrofill phase. As discussed further below, the other waveforms of FIG. 4B demonstrate various pulse techniques.

Terminology

Wafer or Substrate

In this description, the term "semiconductor wafer" or "semiconductor substrate," or simply "substrate" refers to a substrate that has semiconductor material anywhere within its body, and it is understood by one of skill in the art that the semiconductor material does not need to be exposed. The semiconductor substrate may include one or more dielectric and conductive layers formed over the semiconductor material. A wafer used in the semiconductor device industry is typically a circular-shaped semiconductor substrate, which may have a diameter of 200 mm, 300 mm, or 450 mm, for example. The following detailed description describes electrochemical plating, also referred to as "electroplating" or "plating" for short, and the subsequent etching of material plated on a wafer. However, one skilled in the art will appreciate that suitable alternative implementations of that described herein exist, and that the disclosed electroplating operations may be conducted on work pieces of various shapes and sizes, and which are made from various materials. In addition to semiconductor wafers, other work pieces that may take advantage of the disclosed implementations include various articles such as printed circuit boards (PCBs) and/or the like. In some embodiments, the wafer may be glass, with through silicon glass vias, rather than through silicon vias.

Additives

Electroplating for TSV applications and in some cases, WLP applications, may be performed with low current to avoid formation of pinch off voids and to accommodate the diffusion of copper in high aspect ratio features. Additives may be included in the electroplating solution to enable bottom-up fill of features by altering the behavior of the electroplating solution on the substrate. Example additives include suppressors, accelerators, and levelers. In some embodiments, the suppressor acts as both a suppressor and a leveler (e.g., a suppressor may have "leveling character"). An example additive package may include 60 g/L Cu, 60 g/L sulfuric acid, and 50 ppm chloride with HSL-A accelerator and HSL-B suppressor, which is available from Moses Lake Industries of Moses Lake, WA.

During electroplating, changes in additives on the wafer surface may cause voltage drift in constant current electroplating steps. For example, without being bound by a particular theory, it is believed that the surface concentration of suppressor adsorbed on the wafer surface decreases over time as it is displaced by the adsorption of accelerator, thereby decreasing polarization and decreasing the voltage between electrodes. Locally high surface concentration of adsorbed accelerator at the bottom of the vias leads to an increased plating rate in the vias and bottom-up fill. When vias approach nearly complete fill, the local accelerating effect decreases—partly due to the suppressor and/or leveler displacing the accelerator in the vias—and polarization increases. This decrease in the accelerator activity reduces the formation of large bumps over the vias and is generally referred to as "leveling." The suppressors used herein may have leveling character.

Suppressors

While not wishing to be bound to any theory or mechanism of action, it is believed that suppressors (either alone or in combination with other bath additives) are surface polarizing compounds that lead to a significant increase in the voltage drop across the substrate-electrolyte interface, especially when present in combination with a surface chemisorbing halide (e.g., chloride or bromide). The halide may act as a chemisorbed-bridge between the suppressor molecules and the substrate surface. The suppressor both (1) increases the local polarization of the substrate surface at regions where the suppressor is present relative to regions where the suppressor is absent, and (2) increases the polarization of the substrate surface generally. The increased polarization (local and/or general) corresponds to increased resistivity/impedance and therefore slower plating at a particular applied potential.

It is believed that suppressors are not significantly incorporated into the deposited film, though they may slowly degrade over time by electrolysis or chemical decomposition in the bath. Suppressors are often relatively large molecules, and in many instances they are polymeric in nature (e.g., polyethylene oxide, polypropylene oxide, polyethylene glycol, polypropylene glycol, etc). Other examples of suppressors include polyethylene and polypropylene oxides with S- and/or N-containing functional groups, block polymers of polyethylene oxide and polypropylene oxides, etc. The suppressors can have linear chain structures or branch structures or both. It is common that suppressor molecules with various molecular weights co-exist in a commercial suppressor solution. Due in part to suppressors' large size, the diffusion of these compounds into a recessed feature can be relatively slow compared to other bath components.

Some suppressors include leveling character. Although a leveler may be used in conjunction with a suppressor and/or accelerator, some suppressors may include leveling behavior sufficient for disclosed embodiments.

While not wishing to be bound by any theory or mechanism of action, it is believed that levelers (either alone or in combination with other bath additives) act as suppressing agents, in some cases to counteract the depolarization effect associated with accelerators, especially in exposed portions of a substrate, such as the field region of a substrate being processed, and at the side walls of a feature. The leveler may locally increase the polarization/surface resistance of the substrate, thereby slowing the local electrodeposition reaction in regions where the leveler is present. The local concentration of levelers is determined to some degree by mass transport. Therefore levelers act principally on surface structures having geometries that protrude away from the surface. This action "smooths" the surface of the electrodeposited layer. It is believed that in many cases the leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, levelers often contain one or more nitrogen, amine, imide, or imidazole, and may also contain sulfur functional groups. Certain levelers include one or more five- and six-member rings and/or conjugated organic compound derivatives. Nitrogen groups may form part of the ring structure. In amine-containing levelers, the amines may be primary, secondary, or tertiary alkyl amines. Furthermore, the amine may be an aryl amine or a heterocyclic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be especially useful. An example of a leveler is Janus Green B. Leveler compounds may also include ethoxide groups. For example, the leveler may include a general backbone similar to that found in polyethylene glycol or polyethyelene oxide, with fragments of amine functionally inserted over the chain (e.g., Janus Green B). Example epoxides include, but are not limited to, epihalohydrins such as epichlorohydrin and epibromohydrin, and polyepoxide compounds. Polyepoxide compounds having two or more epoxide moieties joined together by an ether-containing linkage may be especially useful. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Accelerators

While not wishing to be bound by any theory or mechanism of action, it is believed that accelerators (either alone or in combination with other bath additives) tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator). Example accelerators include, but are not limited to, dimercaptopropane sulfonic acid, dimercaptoethane sulfonic acid, mercaptopropane sulfonic acid, mercaptoethane sulfonic acid, bis-(3-sulfopropyl) disulfide (SPS), and their derivatives. Although the accelerator may become strongly adsorbed to the substrate surface and generally laterally-surface immobile as a result of the plating reactions, the accelerator is generally not significantly incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors.

Bottom-Up Fill

In the bottom-up fill mechanism, a recessed feature on a plating surface tends to be plated with metal from the bottom to the top of the feature, and inward from the sidewalls towards the center of the feature. The deposition rate may be controlled within the feature and in the field region to achieve uniform filling and avoid incorporating voids into the features. The three types of additives described above are beneficial in accomplishing bottom-up fill, each working to selectively increase or decrease the polarization at the substrate surface.

In the later stages of plating, particularly as overburden deposits, the accelerator may build up in certain regions (e.g., above filled features) undesirably, resulting in local faster-than-desired plating. Levelers may be used to counteract this effect. Without leveler, a feature may tend to overfill and produce a bump. Therefore, in the later stages of bottom-up fill plating, levelers are beneficial in producing a relatively flat deposit.

The use of suppressor, accelerator, and leveler, in combination, may allow a feature to be filled without voids from the bottom-up and from the sidewalls-inward, while producing a relatively flat deposited surface. The exact identity/composition of the additive compounds are typically maintained as trade secrets by the additive suppliers, thus, information about the exact nature of these compounds is not publicly available.

Open Area

The term "open area" as used herein may refer to the fraction of a substrate surface occupied by vias or other features. Open area does not account for depth of the features; it is measured over a plane on the surface of the substrate. Techniques described herein may be particularly suited for substrates having "high" open areas, e.g., open areas greater than 0.9% or greater than about 1%. Medium or low open area may generally be open areas less than 0.9% or less that about 1%. Substrates with high open area may have a greater number of TSVs than typical and/or larger diameter TSVs than typical.

Electrofill Current Waveform

The term "electrofill current waveform" or "current waveform" as used herein may refer to a graph of current applied during electroplating as a function of time. A typical current waveform may have an initial induction phase followed by a bulk electrofill phase. An induction phase may have very little or no current flowing. The bulk electrofill phase may have a series of constant current steps. E.g., 2-6 steps. The steps may sequentially increase in magnitude. The bulk electrofill phase may be divided into one or more steps of increasing current over the course of the plating process. Techniques described herein may begin the bulk electrofill phase with a pulse followed by substantially constant portions. Generally, the techniques described herein describe current values as applied to a 300 mm wafer and may be suitably adjusted for wafers of different sizes. Current density values are based on the planar (blanket) surface area of a wafer, and do not account for additional surface area provided by features of the substrate.

Pulse

The term "pulse" as used herein may refer to a large increase in current before decreasing the current down to the first step of the bulk electrofill phase. The current of a pulse is higher than the bulk electrofill phase, and in some embodiments may be at least double the current of the following current step of the bulk electrofill phase. The decrease in current from the pulse to the first step of the bulk electrofill phase may be accomplished in a variety of ways, including an immediate step change, a decrease over time (a "ramp"), or some other function that decreases the current from the pulse current to the bulk electrofill current. A pulse may have one or more ramps and/or one or more step changes.

Copper

Copper-containing metal as discussed herein is referred to as "copper" which includes without limitation, pure copper metal, copper alloys with other metals, and copper metal impregnated with non-metallic species, such as with organic and inorganic compounds used during electrofill operations (e.g., levelers, accelerators, suppressors, surface-active agents, etc.). Copper is typically used as the conductive metal in TSV fill as it supports the high current densities experienced at complex integration, such as for 3D packages and 3D integrated circuits. Copper also supports high device speeds. Furthermore, copper has good thermal conductivity and is available in a highly pure state.

While electroplating processes will be primarily described making reference to copper plating and more particularly TSV copper damascene plating, it is understood that the methods provided herein and associated apparatus configurations can be used to perform plating of other metals and alloys, such as Co, Au, Ag, Ni, Ru, Pd, Sn, In, and alloys of any of these such as Sn/Ag or Sn/In alloy, etc., and for through resist plating. The plating electrolytes will include a source of required metal ions (metal salt), and typically an acid in order to increase electrolyte conductivity.

Context—Open Area and TSV Plating Current

For relatively low open area TSV wafers (e.g., open area is less than about 0.9%), in conventionally electroplating operations, one approach is to plate with as high a current as possible (rapid electrofill and high throughput) without introducing voids. At particularly high currents, it is commonly observed that filled features have voids. As described in reference to FIG. 2, higher currents typically result in voids, such as voids 202c and 202d. When working with wafers having low or moderate open areas, the process window is defined with a current that is as high as possible without introducing voids. An optimal current may have the fastest fill rate without introducing voids, which may be the highest current that does not introduce voids, or may be less. As current increases, the fill rate may reach a maximum and decrease before voids result from the high current, thus an optimal current may be less than the maximum possible without introducing voids.

However, this procedure was not found to work with TSV wafers that have relatively high open areas, e.g., open areas of at least 0.9% or greater. When plating onto wafers having such relatively high open areas, it was observed that, as before, at high currents voids would form. However, when moving to lower currents, it was observed that voids would still occur, and eventually a seam would form in the feature, such as seen in feature 200a of FIG. 2. The seam suggests that under these conditions, plating is occurring on the side wall of the feature.

Figure 5:
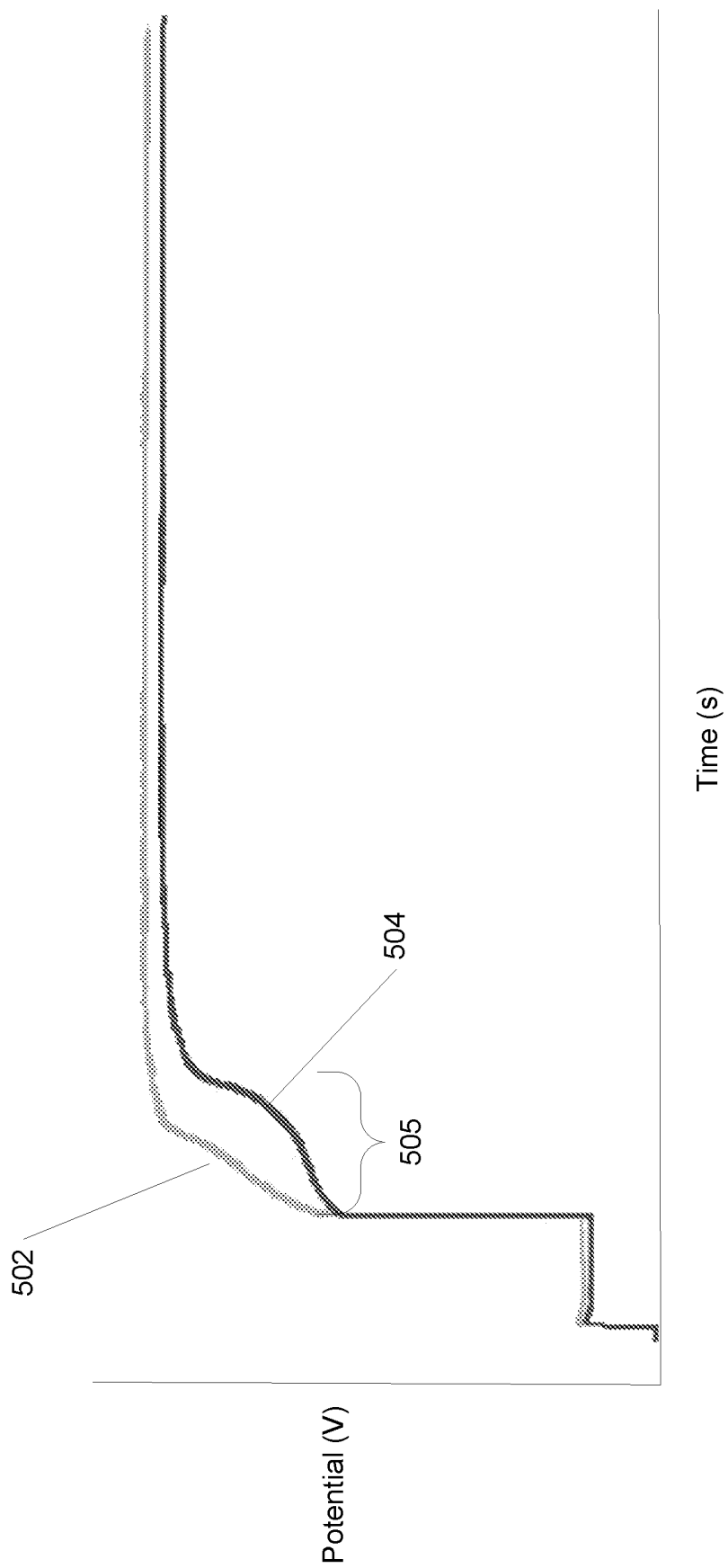
FIG. 5 presents an example current waveform for void and void-free fill.

In an attempt to find an appropriate current process window to plate in high open area features, the inventors investigated potential mechanisms would account for this apparent plating on the side wall. FIG. 5 is a polarization chart for plating a low open area wafer 502 and a high open area wafer 504. During time window 505, low open area wafer 502's potential gradually increases as plating occurs until reaching a stable potential. In contrast, the high open area wafer 504's potential takes much longer to polarize during time window 505. The inventors thought this "shoulder" may be a result of plating ions which require lower polarization, such as cuprous ions, rather than cupric ions.

While not wishing to be bound by theory, the problem of seams forming in TSV features may be attributed to the presence of cuprous ions inside features at the beginning of the bulk fill process. Plating cuprous ions at the beginning the bulk electrofill phase may be reflected by the initially low polarization in the curves in FIG. 5. Wafer's with larger open area have more cuprous ions and/or a lower driving force for electroplating, which manifest as the larger delay in polarization.

Prior to bulk electroplating, cuprous ions may accumulate in locally high concentrations within features. The equilibrium concentration of cuprous ions near the Cu seed layer in the acidic electroplating solution gets higher as the potential approaches the open circuit potential. Therefore a higher cuprous ion concentration is expected near the wafer during an induction period, which has no or very low current (0~60 mA for a 300 mm wafer). Eventually, during electroplating, the excess concentration of cuprous ions decreases as the cuprous ions are reduced to copper metal.

As a consequence, the local concentration of cuprous ions is relatively high adjacent to the surface of the wafer to be plated or that is now being plated. This state exists at least initially during the bulk electroplating phase of the process.

Eventually, during electroplating, the excess concentration of cuprous ions decreases as the cuprous ions are reduced to copper metal. The concentration of cuprous ions in the field region will quickly decrease through convection caused by wafer rotation. However, the cuprous ions in vias will remain at a higher concentration longer since convection will not reach deep in the vias. It has been observed that blanket wafer plating at various currents does not show the shoulder in voltage profile (data not shown), supporting quick consumption of cuprous ions outside of vias. The polarization delay as shown in FIG. 5 may further support this; after time window 505 the polarization curves for the low open area wafer 502 and the high open area wafer 504 realign. As open area increases, which means that there are more features where cuprous ion concentration remains high even under strong convection, a longer delay is observed as shown in FIG. 5; after time window 505, during which cuprous ions in vias are reduced, the polarization curves for the low open area wafer 502 and the high open area wafer 504 realign.

While a higher concentration of cuprous ions alone may be insufficient to cause voids, it is believed that cuprous ions may complex with additives or byproducts of additives in the features, and the complexed cuprous ions may attach to the side wall or otherwise interfere with the suppressing effect of suppressor molecules on the sidewalls of the features being filled. Because plating on sidewalls is not suppressed early in the deposition process, plating can occur on the sidewalls, which can produce seams in the filled features.

In contrast to cuprous ions, cupric ions may not interfere with suppression on the sidewalls of wafer features. However, because cuprous ions are produced at the wafer surface where the copper seed layer resides, and much of the interface resides in features, the cuprous ions can remain locally concentrated within the features.

It is believed that the interference from cuprous ions may be less severe for low open area wafers due to a smaller contribution of high local current in vias to the total current. After the induction period, initial plating is easier (i.e., reduced at lower overpotential) in vias than the field because of a higher concentration of cuprous ions in the vias. In some waveforms, via current density is sufficiently higher than field current density to cause polarization and not have severe side wall growth. In order to have the same via fill environment for high open area wafers, a similarly higher current density should be maintained in the vias by comparison to the field regions.

For example, when the open area increases from 0.05% to 0.5% with 10 um×100 um vias (opening to depth), the total surface area on the substrate face increases from 102% to 120% (100% is blanket wafer area for a 300 mm wafer). As an example, the total current may increase (for the high open area case) by more than 200% to achieve a similar via current density and field current density (field current density×field area+via current density×via surface area). Current calculations based on the increase in surface area and bulk fill current can significantly underestimate the optimum current for high open area wafers. It is believed that low current plating (which may be appropriate for low open area substrates) may slow down the initial polarization during the initial bulk fill step, causing side wall growth. Furthermore, a higher current may only be useful during the early stage of plating while the cuprous ions are abundant in vias. Once the excess cuprous ions are all reduced, and cuprous ion concentration in the features approaches that in the bulk solution, the current may be changed to a lower, bulk fill current.

Certain embodiments of this disclosure may address the locally high concentrations of cuprous ion present within the features at the beginning of the bulk electro fill phase of the deposition process.

Process Flow

Figure 3:
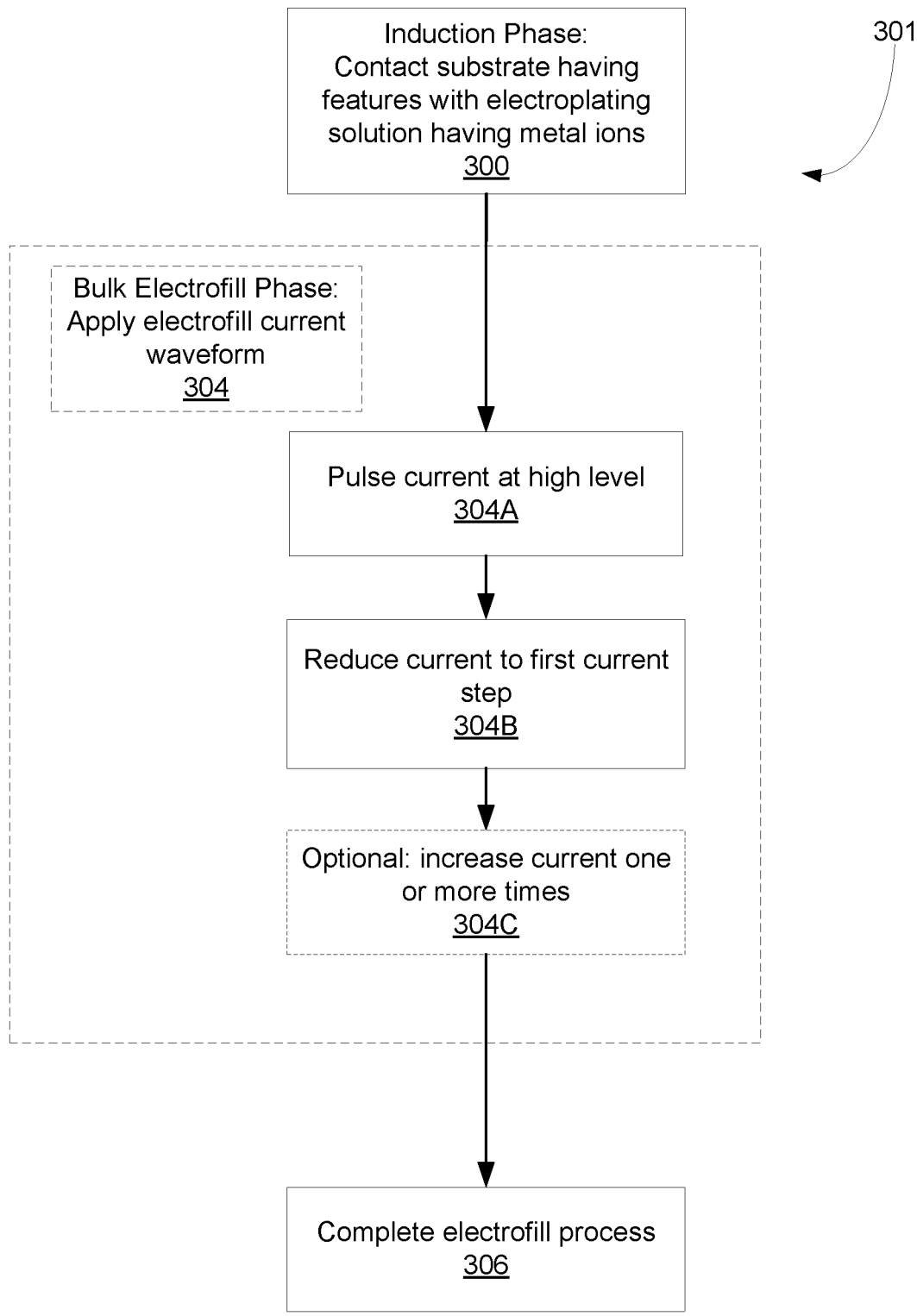
FIG. 3 presents a flow diagram of an operation for one example embodiment.

FIG. 3 presents a flowchart for a process 301 that electroplates metal into features of a wafer, which in some embodiments may be a wafer with TSVs and a high open area. Starting at operation 300, a substrate having features to be filled is contacted with an electroplating solution having metal ions as described herein. During the induction phase a minimal current may be applied to the wafer, such as between about 0-120 mA for a 300 mm wafer. The induction current may reduce the rate of conversion of a copper seed layer within the features to cuprous ions.

In operation 304, the features are filled with metal through a bulk electrofill process by applying a current waveform to the wafer. FIG. 4A provides an illustration of an example current and voltage waveform. As may be seen, the current beings at a zero or minimal level, followed by a pulse with a ramp down to a first bulk electrofill current step, and then a second current step. The voltage waveform generally follows the current waveform.

The bulk electrofill operation 304 begins with a pulse in operation 304A. The pulse may be performed using various waveforms. FIG. 4B illustrates four different pulses, as well as a waveform with no pulse. The pulse generally hits a maximum value followed by either an immediate step down to the first current step, or a decrease over a period of time to the first current step. In some embodiments, the maximum current of the pulse is at least about 2 times the current of the first current step, or between about 3 times and about 5 times the current of the first step. In some embodiments, the maximum current of the pulse may be about 2A for a 300 mm wafer, or between about 0.5 A and 5 A for a 300 mm wafer. In some embodiments, a duration of the pulse is at least about 10 seconds before a step down to the first current step. In some embodiments, the pulse decreases to the first current step over time linearly (a "ramp"). The duration of the ramp down may be at least about 30 seconds. In some embodiments, the duration of the pulse, including the ramp, may be between about 10 seconds and 200 seconds. In some embodiments, rather than ramping down immediately as shown in FIG. 4B, the maximum current is maintained for a duration, such as at least 10 seconds, before a ramp down. In some embodiments the ramp down is not linear and may decrease by a different function.

Figure 4C:
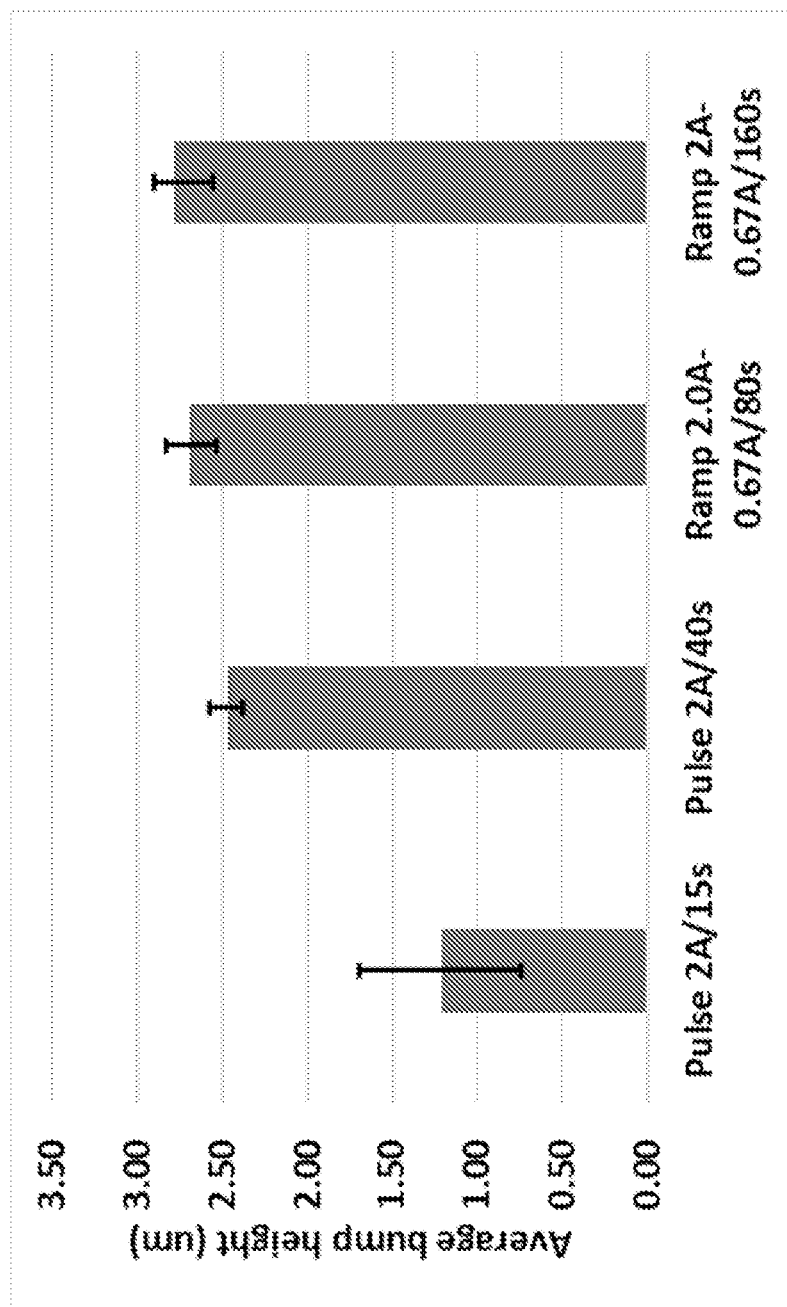
FIG. 4C presents an illustration of bump heights for various current waveforms.

The effect of various pulse waveforms is illustrated by FIG. 4C, which shows an average bump height for the waveforms illustrated in FIG. 4B after the electroplating process is complete. Generally, higher average bump height is better, as it indicates a faster plating rate. The 15 second pulse had the smallest height, or plating rate, but also provided a void-free deposition. The 40 second pulse and the ramp down pulses had better bump heights, or plating rates, with the two ramp down current waveforms having slightly better bump heights. This may be due to the ramps better reducing cuprous ions or better tracking the decrease in cuprous ion concentration over time. However, as current increases the risk of voids increases.

In operation 304B a first current step, or baseline current is applied. As described above, in typical electroplating process the current may be increased by multiple steps. After applying a pulse, the current is reduced to the baseline current and electroplating proceeds through potentially multiple steps. A step down to the baseline current after the pulse may be important to avoid causing voids; if the applied current is maintained at the pulse value for too long, the problems associated with high current in regard to features 200c and 200d of FIG. 2 may occur. Using a baseline current or first current step may help stabilize the bottom-up fill mechanism before increasing the current in subsequent steps. As plating rate generally increases with higher current, it is advantageous to maximize the current applied so long as voids do not occur. Operation 304C is a repeatable operation to increase the current one or more times in order to achieve increased plating rates. Generally, each current step increases the current substantially immediately. In operation 306 the electrofill process is completed, which may include transferring the wafer to a different bath or process chamber, or performing a different process on the wafer.

Wafer Fill Rate and Uniformity

Figure 6:
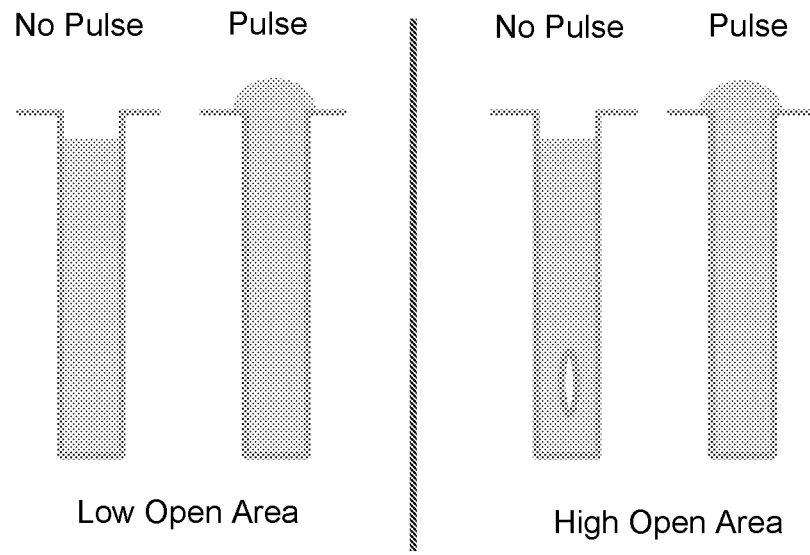
FIG. 6 presents an illustration of filled features for different open areas.

In addition to reducing the presence of voids, other benefits to the techniques described herein is improving the fill rate and uniformity of fill between areas of a die or wafer having high open area and low open area. FIG. 6 illustrates that a low open area may fill without voids regardless of whether a pulse is performed. However, using a pulse allows the feature to fill faster without the presence of voids. Similarly, high open areas may have a void when the current waveform does not include a pulse, as discussed above. Using a pulse as described herein allows for the high open area to fill not only void-free or with reduced voids, but also fill at a faster rate. This may be due to the pulse increasing the nucleation effect for bottom-up fill without increasing the risk or presence of voids. This may also be due to the pulse decreasing side wall growth. Removing cuprous ions may improve the contrast between bottom-up fill and side wall/field growth.

Figure 7:
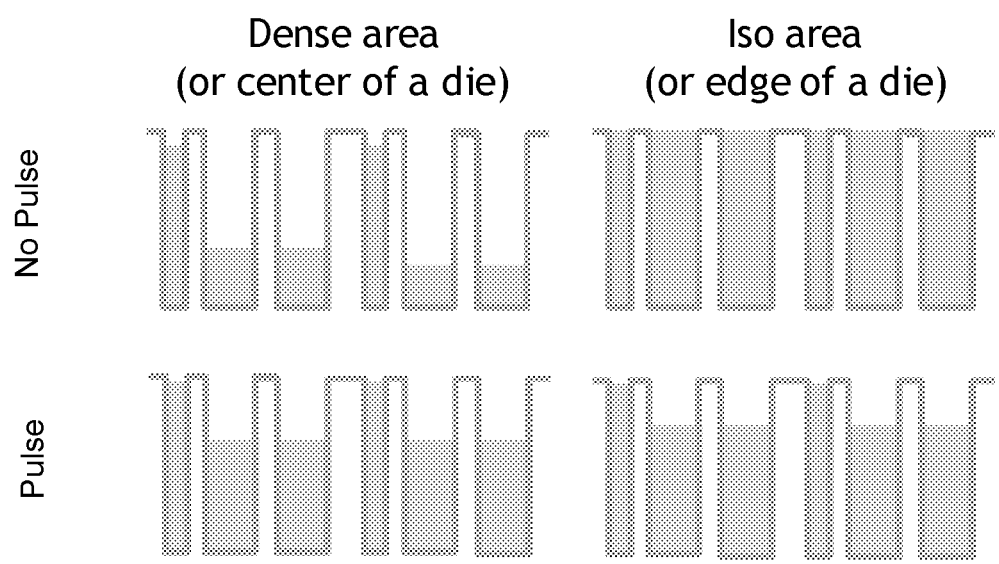
FIG. 7 presents an illustration of filled features based on various embodiments discussed herein.

FIG. 7 demonstrates how fill rates may be more uniform across a die or wafer. Without a pulse, dense areas, or high open area portions of a die, may have a reduced plating rate compared to isolated areas, or low open area portions of a die. Using a pulse may increase the uniformity in fill rates between portions of a die having high and low open area. Greater uniformity in plating rates across the wafer is favorable, as there is less overburden that needs to be removed in a subsequent process.

In some embodiments, the pulse technique described herein may be used with wafers that have an open area between about 0.01% and 5%. While a pulse is useful for high open area wafers in order to avoid voids, a pulse as described herein may be used with wafers having a lower open area to increase the fill rate and uniformity of fill, as described in reference to FIG. 7. Thus, pulse techniques as described herein are not limited to high open area wafers.

Electroplating Solution

Generally, the electroplating solution can contain one or more copper salts, which may include without limitation copper sulfate, copper methanesulfonate, copper propanesulfonate, copper gluconate, copper pyrophosphate, copper sulfamate, copper nitrate, copper phosphate, copper chloride, and their various combinations. In some embodiments, copper sulfate, and copper alkanesulfonates are preferred sources of copper ions. Mixtures of copper sulfate and copper alkanesulfonates may be used in some embodiments. The concentration of copper ions in a typical electrolyte is at least about 10 g/L, such as between about 10 g/L and 200 g/L. In some embodiments, high concentrations of copper are preferred for faster plating. For example high copper electrolytes containing at least about 40 g/L such as at least about 60 g/L of $Cu^{2+}$ ion (e.g., between about 40-200 g/L, such as between about 60-150 g/L) are used in some embodiments. While in some embodiments electroplating is performed at room temperature (e.g., at about 20-25° C.), in other embodiments it may be preferable to conduct electroplating at an elevated temperature in order to increase the solubility of copper salts, and, consequently, the available copper ion concentration. The higher temperature also allows for faster diffusion of the copper ions and therefore higher achievable plating rates. For example, in some embodiments, electroplating is performed at an elevated electrolyte temperature of about 30-80° C., such as between about 40-60° C. Most commonly, plating is performed at electrolyte temperatures of between about 20-60° C.

In some embodiments (although not necessarily), the electrolyte further includes an acid, such as sulfuric acid, methanesulfonic acid, propanesulfonic acid, nitric acid, phosphoric acid, hydrochloric acid and various combinations thereof. For example, the electrolyte solution in one embodiment contains copper sulfate and sulfuric acid. When sulfuric and/or methanesulfonic acid is used, concentrations of at least about 1 g/L, are preferred, such as about 60 g/L. The acid serves to increase the conductivity of electrolyte. Preferably electrolytes with conductivities of at least about 40 mS/cm are used, such as electrolyte with a conductivity of between about 200 and 300 mS/cm. Such electrolytes can be obtained, for example, by using sulfuric acid and/or methanesulfonic acid at a concentration of at least about 1 g/L, such as about 60 g/L. In some embodiments, the electrolyte comprises sulfuric acid and/or methanesulfonic acid at concentrations of between about 10-200 g/L. In some implementations high acid electrolytes, which contain at least about 0.4 M of strong acid, such as between about 1-2 M of strong acid, are preferred for high speed plating. For example, high acid electrolytes containing between about 40-200 g/L of sulfuric acid, methanesulfonic acid or mixtures thereof, are used in some embodiments. In some embodiments about 60 g/L of sulfuric acid is used and/or the electrolyte has about 0.6M of strong acid.

In some embodiments, the plating solution contains chloride ion at a concentration of between about 5-300 ppm.

In some embodiments, the plating solution may further include accelerators. Accelerators may include a sulfur, oxygen, or nitrogen functional group that help to increase deposition rates and may promote dense nucleation leading to films with a fine grain structure. In some embodiments, accelerators include a S—S disulfide group. Accelerators may be present at a low concentration level, for example 1-200 ppm. Examples of accelerators include 3-Mercapto-1-propanesulfonic acid, bis-(3-sodiumsulfopropyldisulfide) (SPS), and N,N-dimethyl-dithiocarbamyl propylsulfonate (DPS).

In some embodiments, the plating solution may further include electrochemical suppressors. Suppressors are additives that reduce the plating rate and are usually present in the plating bath at higher concentrations than accelerators, for example, at 5-1,000 ppm. They are generally polymeric surfactants with high molecular weight, such as polyethylene glycol (PEG) and polyethyleneoxide (PEO) or block copolymers of the two. The suppressor molecules slow down the deposition rate by adsorbing on the surface and forming a barrier layer to the copper ions. Because of their large size and low diffusion rate, suppressors are less likely to reach the lower part of the TSV than the wafer field resulting in lower initial concentrations at the bottom of the TSV. Therefore, most of suppressing effect occurs initially on the surface of the substrate (field region), helping to reduce overburden and avoid TSV hole "closing". In some embodiments, the accelerators are used in combination with the suppressors. The large size of the suppressor allows for it to diffuse into the feature slower than the accelerator and therefore there is an initial build up of accelerator at the bottom for the feature. This then repels the adsorption of the suppressor and therefore creates a suppression differential between the field and the bottom of the feature which drives the fill from the bottom up.

In some embodiments, the plating solution may include levelers. Levelers are the additives whose purpose it is to deactivate the fast moving accelerated surface and also planarize the field. They are present, if at all, in very small concentrations, such as 1-500 ppm, and their blocking effects at the surface are highly localized. Levelers are also generally electrochemically active (unlike the suppressor molecule). The reaction rate of the leveler at the surface combined with their generally low concentration cause the leveler to often be driven by diffusional effects. As a result, levelers selectively reduce deposition mainly on the high spots of the plated substrate allowing the low spots to level out. This behavior can also be used to enhance the plating rate of copper at the base of the TSV relative to the growth rate on the wafer field. In some cases, levelers may contain functional groups which include nitrogen atoms which exhibit a tendency to form complexes with Cu(I) ions at the wafer interface.

In some embodiments, the additives further reduce the current density (and the plating rate) in the field and at the upper lip of the TSV relative to the current density in the field that would have been obtained in the absence of additives. The additives help achieve void-free filling by increasing the relative plating rate at feature bottom relative to feature opening, and can be used in synergy with the DSI compounds. This differential is often termed "throwing power".

Examples of suitable electrolyte compositions are listed below:
1. 60 g/l $Cu^{2+}$ (in the form of copper sulfate)/60 g/l $H_2SO_4$/60 ppm $Cl^-$+60 ppm Benzyldimethylhexadecylammonium chloride
2. 50 g/l $Cu^{2+}$ (in the form of copper sulfate)/100 g/l $H_2SO_4$/50 ppm $Cl^-$+50 ppm Benzyldimethylhexadecylammonium chloride
3. 70 g/l $Cu^{2+}$ (in the form of copper sulfate)+50 ppm Benzyldimethylhexadecylammonium chloride
4. 50 g/l $Cu^{2+}$ (in the form of copper sulfate)/100 g/l $H_2SO_4$+50 pm Benzyldimethylhexadecylammonium chloride
5. 50 g/l $Cu^{2+}$/10 g/l $H_2SO_4$+30 ppm Thonzonium Bromide
6. 120 g/l $Cu^{2+}$ ((in the form of copper methanesulfonate)/ 20 g/l Methane Sulfonic Acid/50 ppm $Cl^-$+1 ppm Accelerator+200 ppm Suppressor+Enthone DVF200 C.

Apparatus

Figure 8:
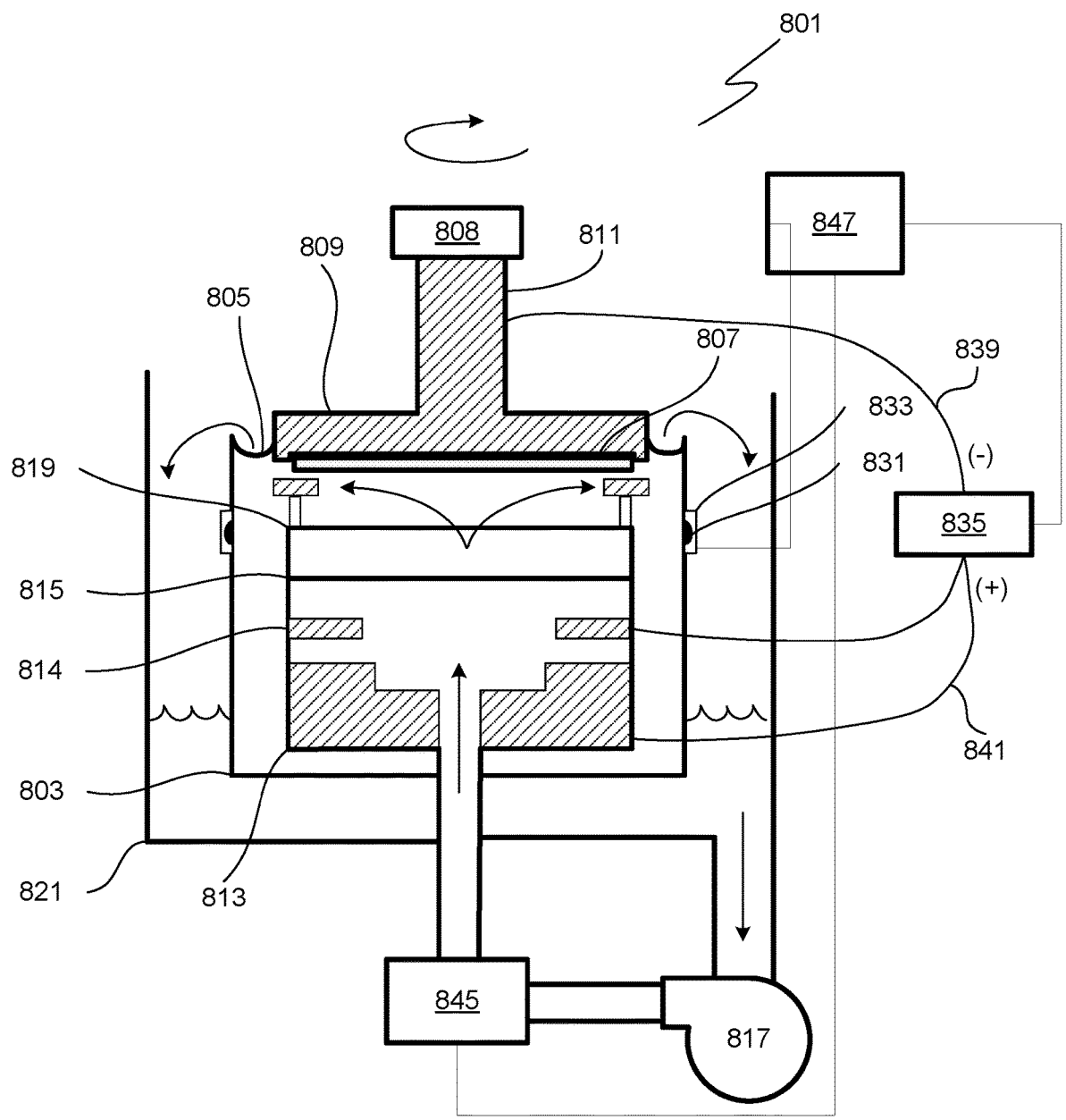
FIGS. 8-11 are schematic diagrams of examples of process chambers for performing methods in accordance with disclosed embodiments.

FIG. 8 presents an example of an electroplating cell in which electroplating may occur. Often, an electroplating apparatus includes one or more electroplating cells in which the substrates (e.g., wafers) are processed. Only one electroplating cell is shown in FIG. 8 to preserve clarity. To optimize bottom-up electroplating, additives (e.g., accelerators, suppressors, and levelers) are added to the electrolyte; however, an electrolyte with additives may react with the anode in undesirable ways. Therefore, anodic and cathodic regions of the plating cell are sometimes separated by a membrane so that plating solutions of different composition may be used in each region. Plating solution in the cathodic region is called catholyte; and in the anodic region, anolyte.

A number of engineering designs can be used in order to introduce anolyte and catholyte into the plating apparatus.

Referring to FIG. 8, a diagrammatical cross-sectional view of an electroplating apparatus 801 in accordance with one embodiment is shown. The plating bath 803 contains the plating solution (having a composition as provided herein), which is shown at a level 805. The catholyte portion of this vessel is adapted for receiving substrates in a catholyte. A wafer 807 is immersed into the plating solution and is held by, e.g., a "clamshell" substrate holder 809, mounted on a rotatable spindle 811, which allows rotation of clamshell substrate holder 809 together with the wafer 807. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are incorporated herein by reference in their entireties.

An anode 813 is disposed below the wafer within the plating bath 803 and is separated from the wafer region by a membrane 815, preferably an ion selective membrane. For example, Nafion™ cationic exchange membrane (CEM) may be used. The region below the anodic membrane is often referred to as an "anode chamber." The ion-selective anode membrane 815 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference in their entireties. Ion exchange membranes, such as cationic exchange membranes, are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the TSV hole or other feature. A typical way to assist the diffusion is through convection flow of the electroplating solution provided by the pump 817. Additionally, a vibration agitation or sonic agitation member may be used as well as wafer rotation. For example, a vibration transducer 808 may be attached to the clamshell substrate holder 809.

The plating solution is continuously provided to plating bath 803 by the pump 817. Generally, the plating solution flows upwards through an anode membrane 815 and a diffuser plate 819 to the center of wafer 807 and then radially outward and across wafer 807. The plating solution also may be provided into the anodic region of the bath from the side of the plating bath 803. The plating solution then overflows plating bath 803 to an overflow reservoir 821. The plating solution is then filtered (not shown) and returned to pump 817 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 831 is located on the outside of the plating bath 803 in a separate chamber 833, which chamber is replenished by overflow from the main plating bath 803. Alternatively, in some embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 831 is typically employed when electroplating at a controlled potential is desired. The reference electrode 831 may be one of a variety of commonly used types such as mercury/mercury sulfate, silver chloride, saturated calomel, or copper metal. A contact sense lead in direct contact with the wafer 807 may be used in some embodiments, in addition to the reference electrode, for more accurate potential measurement (not shown).

A DC power supply 835 can be used to control current flow to the wafer 807. The power supply 835 has a negative output lead 839 electrically connected to wafer 807 through one or more slip rings, brushes and contacts (not shown). The positive output lead 841 of power supply 835 is electrically connected to an anode 813 located in plating bath 803. The power supply 835, a reference electrode 831, and a contact sense lead (not shown) can be connected to a system controller 847, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 835 biases the wafer 807 to have a negative potential relative to anode 813. This causes an electrical current to flow from anode 813 to the wafer 807, and an electrochemical reduction (e.g. $Cu^{2+}+2e^-=Cu^0$) occurs on the wafer surface (the cathode), which results in the deposition of the electrically conductive layer (e.g. copper) on the surfaces of the wafer. An inert anode 814 may be installed below the wafer 807 within the plating bath 803 and separated from the wafer region by the membrane 815.

The apparatus may also include a heater 845 for maintaining the temperature of the plating solution at a specific level. The plating solution may be used to transfer the heat to the other elements of the plating bath. For example, when a wafer 807 is loaded into the plating bath the heater 845 and the pump 817 may be turned on to circulate the plating solution through the electroplating apparatus 801, until the temperature throughout the apparatus becomes substantially uniform. In one embodiment the heater is connected to the system controller 847. The system controller 847 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus. Non-transitory machine-readable media containing instructions for controlling process operations in accordance with the present embodiments may be coupled to the system controller.

Typically there will be a user interface associated with controller 847. The user interface may include a display screen, graphical software displays of the apparatus and/or process conditions, and user input devices such as pointing devices, keyboards, touch screens, microphones, etc. The computer program code for controlling electroplating processes can be written in any conventional computer readable programming language: for example, assembly language, C, C++, Pascal, Fortran or others. Compiled object code or script is executed by the processor to perform the tasks identified in the program. One example of a plating apparatus that may be used according to the embodiments herein is the Lam Research Sabre tool. Electrodeposition can be performed in components that form a larger electrodeposition apparatus.

Figure 9:
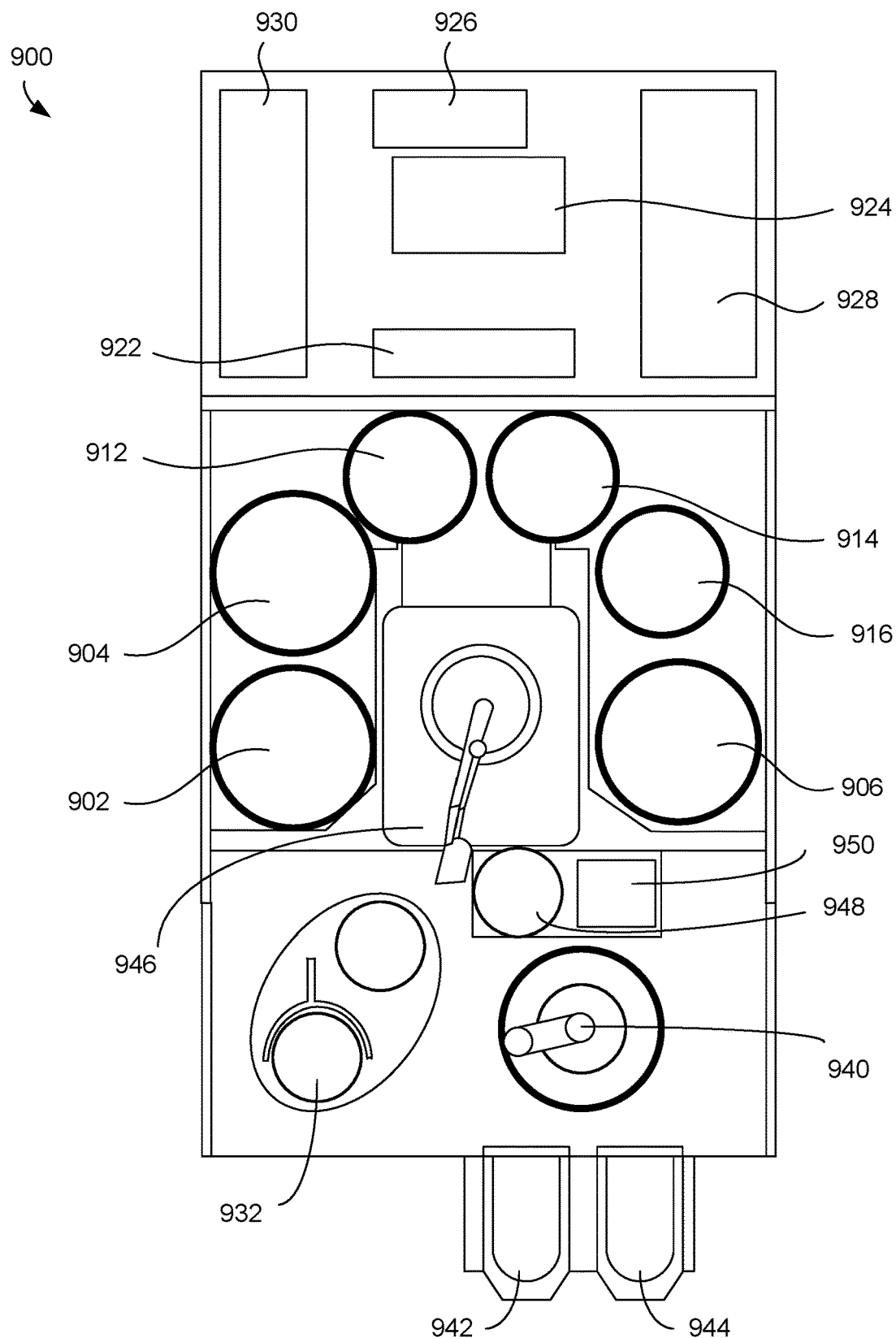

FIG. 9 shows a schematic of a top view of an example electrodeposition apparatus. The electrodeposition apparatus 900 can include three separate electroplating modules 902, 904, and 906. The electrodeposition apparatus 900 can also include three separate modules 912, 914, and 916 configured for various process operations. For example, in some embodiments, one or more of modules 912, 914, and 916 may be a spin rinse drying (SRD) module. In other embodiments, one or more of the modules 912, 914, and 916 may be post-electrofill modules (PEMs), each configured to perform a function, such as edge bevel removal, backside etching, and acid cleaning of substrates after they have been processed by one of the electroplating modules 902, 904, and 906.

The electrodeposition apparatus 900 includes a central electrodeposition chamber 924. The central electrodeposition chamber 924 is a chamber that holds the chemical solution used as the electroplating solution in the electroplating modules 902, 904, and 906. The electrodeposition apparatus 900 also includes a dosing system 926 that may store and deliver additives for the electroplating solution. A chemical dilution module 922 may store and mix chemicals to be used as an etchant. A filtration and pumping unit 928 may filter the electroplating solution for the central electrodeposition chamber 924 and pump it to the electroplating modules.

A system controller 930 provides electronic and interface controls required to operate the electrodeposition apparatus 900. The system controller 930 (which may include one or more physical or logical controllers) controls some or all of the properties of the electroplating apparatus 900.

Signals for monitoring the process may be provided by analog and/or digital input connections of the system controller 930 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

A hand-off tool 940 may select a substrate from a substrate cassette such as the cassette 942 or the cassette 944. The cassettes 942 or 944 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 940 may hold the substrate using a vacuum attachment or some other attaching mechanism.

The hand-off tool 940 may interface with a wafer handling station 932, the cassettes 942 or 944, a transfer station 950, or an aligner 948. From the transfer station 950, a hand-off tool 946 may gain access to the substrate. The transfer station 950 may be a slot or a position from and to which hand-off tools 940 and 946 may pass substrates without going through the aligner 948. In some embodiments, however, to ensure that a substrate is properly aligned on the hand-off tool 946 for precision delivery to an electroplating module, the hand-off tool 946 may align the substrate with an aligner 948. The hand-off tool 946 may also deliver a substrate to one of the electroplating modules 902, 904, or 906 or to one of the three separate modules 912, 914, and 916 configured for various process operations.

An example of a process operation according to the methods described above may proceed as follows: (1) electrodeposit copper or another material onto a substrate in the electroplating module 904; (2) rinse and dry the substrate in SRD in module 912; and, (3) perform edge bevel removal in module 914.

An apparatus configured to allow efficient cycling of substrates through sequential plating, rinsing, drying, and PEM process operations may be useful for implementations for use in a manufacturing environment. To accomplish this, the module 912 can be configured as a spin rinse dryer and an edge bevel removal chamber. With such a module 912, the substrate would only need to be transported between the electroplating module 904 and the module 912 for the copper plating and EBR operations. In some embodiments the methods described herein will be implemented in a system which comprises an electroplating apparatus and a stepper.

Figure 10:
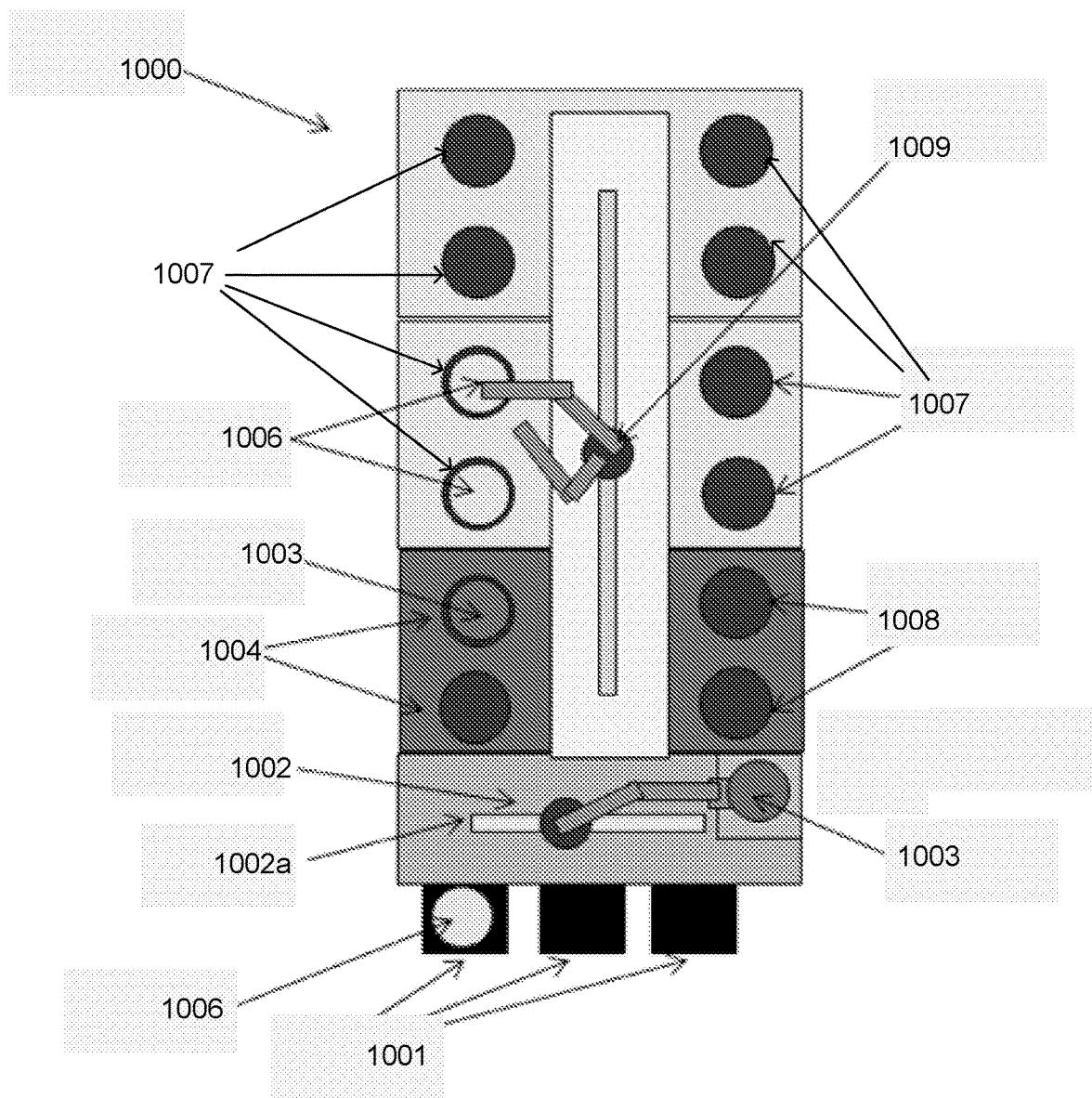

An alternative embodiment of an electrodeposition apparatus 1000 is schematically illustrated in FIG. 10. In this embodiment, the electrodeposition apparatus 1000 has a set of electroplating cells 1007, each containing an electroplating bath, in a paired or multiple "duet" configuration. In addition to electroplating per se, the electrodeposition apparatus 1000 may perform a variety of other electroplating related processes and sub-steps, such as spin-rinsing, spin-drying, metal and silicon wet etching, electroless deposition, pre-wetting and pre-chemical treating, reducing, annealing, electro-etching and/or electropolishing, photoresist stripping, and surface pre-activation, for example. The electrodeposition apparatus 1000 is shown schematically looking top down in FIG. 10, and only a single level or "floor" is revealed in the figure, but it is to be readily understood by one having ordinary skill in the art that such an apparatus, e.g., the Lam Sabre™ 3D tool, can have two or more levels "stacked" on top of each other, each potentially having identical or different types of processing stations.

Referring once again to FIG. 10, the substrates 1006 that are to be electroplated are generally fed to the electrodeposition apparatus 1000 through a front end loading FOUP 1001 and, in this example, are brought from the FOUP to the main substrate processing area of the electrodeposition apparatus 1000 via a front-end robot 1002 that can retract and move a substrate 1006 driven by a spindle 1003 in multiple dimensions from one station to another of the accessible stations-two front-end accessible stations 1004 and also two front-end accessible stations 1008 are shown in this example. The front-end accessible stations 1004 and 1008 may include, for example, pre-treatment stations, and spin rinse drying (SRD) stations. Lateral movement from side-to-side of the front-end robot 1002 is accomplished utilizing robot track 1002a. Each of the substrates 1006 may be held by a cup/cone assembly (not shown) driven by a spindle 1003 connected to a motor (not shown), and the motor may be attached to a mounting bracket 1009. Also shown in this example are the four "duets" of electroplating cells 1007, for a total of eight electroplating cells 1007. A system controller (not shown) may be coupled to the electrodeposition apparatus 1000 to control some or all of the properties of the electrodeposition apparatus 1000. The system controller may be programmed or otherwise configured to execute instructions according to processes described earlier herein.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 11:
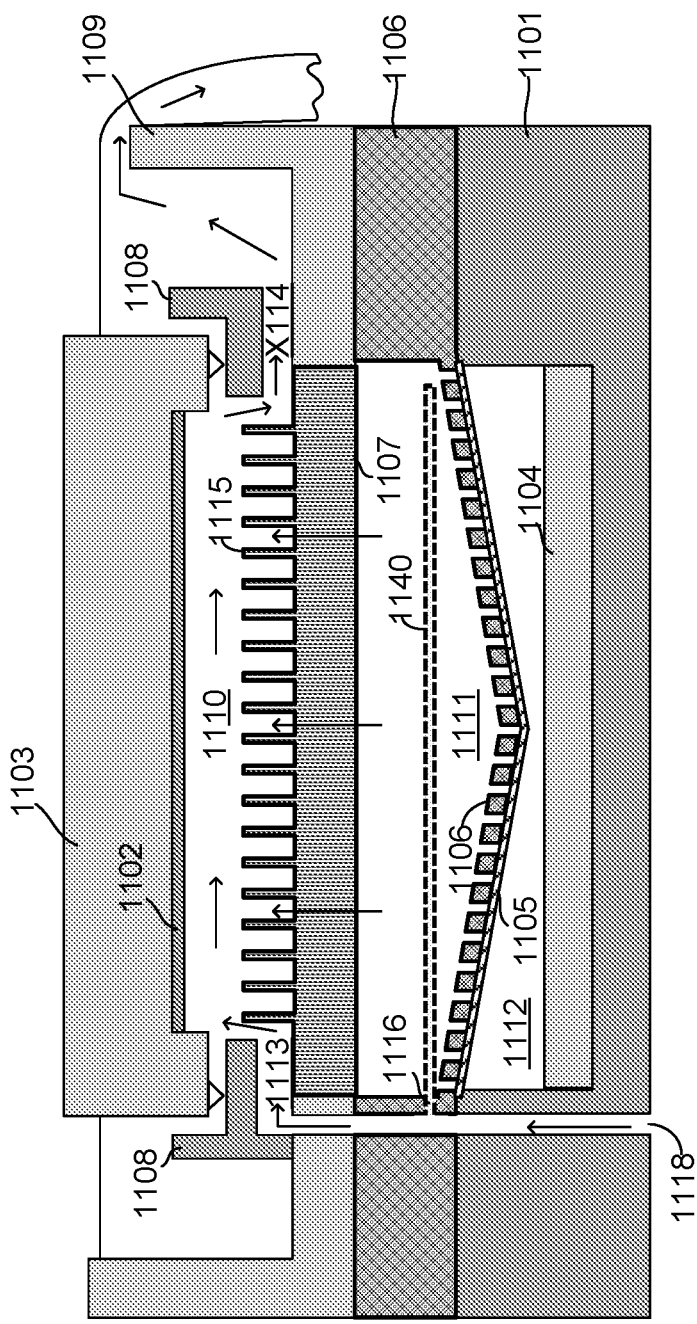

FIG. 11 depicts a simplified cross-sectional view of an electroplating apparatus. The apparatus includes an electroplating cell 1101, with substrate 1102 positioned in a substrate holder 1103. Substrate holder 1103 is often referred to as a cup, and it may support the substrate 1102 at its periphery. An anode 1104 is positioned near the bottom of the electroplating cell 1101. The anode 1104 is separated from the substrate 1102 by a membrane 1105, which is supported by a membrane frame 1106. Membrane frame 1106 is sometimes referred to as an anode chamber membrane frame, as it defines the top of the anode chamber housing the anode. Further, the anode 1104 is separated from the substrate 1102 by an ionically resistive element 1107. The ionically resistive element 1107 includes openings that allow electrolyte to travel through the ionically resistive element 1107 to impinge upon the substrate 1102. A front side insert 1108 is positioned above the ionically resistive element 1107, proximate the periphery of the substrate 1102. The front side insert 1108 may be ring-shaped, and may be azimuthally non-uniform, as shown. The front side insert 1108 is sometimes also referred to as a cross flow confinement ring.

An anode chamber 1112 is below the membrane 1105, and is where the anode 1104 is located. An ionically resistive element manifold 1111 is above the membrane 1105 and below the ionically resistive element 1107. An inlet 1116, which may be connected with an irrigation flute 1140, delivers catholyte to the ionically resistive element manifold 1111, and may act to irrigate the membrane 1105 during electroplating. In this example, the inlet 1116 and irrigation flute 1140 are fed by electrolyte that passes through catholyte inlet 1118. A cross flow manifold 1110 is above the ionically resistive element 1107 and below the substrate 1102. The height of the cross flow manifold is considered to be the distance between the substrate 1102 and the plane of the ionically resistive element 1107 (excluding the ribs 1115 on the upper surface of the ionically resistive element 1107, if present). In some cases, the cross flow manifold may have a height between about 1 mm-4 mm, or between about 0.5 mm-15 mm. The cross flow manifold 1110 is defined on its sides by the front side insert 1108, which acts to contain the cross flowing electrolyte within the cross flow manifold 1110. A side inlet 1113 to the cross flow manifold 1110 is provided azimuthally opposite a side outlet 1114 to the cross flow manifold 1110. The side inlet 1113 and side outlet 1114 may be formed, at least partially, by the front side insert 1108. As shown by the arrows in FIG. 11, electrolyte travels from the catholyte inlet 1118, through the side inlet 1113, into the cross flow manifold 1110, and out the side outlet 1114. In addition, electrolyte may travel through one or more inlets to the ionically resistive element manifold 1111 (e.g., inlets in irrigation flute 1140 and/or other inlets), into the ionically resistive element manifold 1111, through the openings in the ionically resistive element 1107, into the cross flow manifold 1110, and out the side outlet 1114. After passing through the side outlet 1114, the electrolyte spills over weir wall 1109. The electrolyte may be recovered and recycled.

In certain embodiments, the ionically resistive element 1107 approximates a nearly constant and uniform current source in the proximity of the substrate (cathode) and, as such, may be referred to as a high resistance virtual anode (HRVA) or channeled ionically resistive element (CIRP) in some contexts. Normally, the ionically resistive element 1107 is placed in close proximity with respect to the wafer. In contrast, an anode in the same close-proximity to the substrate would be significantly less apt to supply a nearly constant current to the wafer, but would merely support a constant potential plane at the anode metal surface, thereby allowing the current to be greatest where the net resistance from the anode plane to the terminus (e.g., to peripheral contact points on the wafer) is smaller. So while the ionically resistive element 1107 has been referred to as a high-resistance virtual anode (HRVA), this does not imply that electrochemically the two are interchangeable. Under certain operational conditions, the ionically resistive element 1107 would more closely approximate and perhaps be better described as a virtual uniform current source, with nearly constant current being sourced from across the upper plane of the ionically resistive element 1107.

The ionically resistive element 1107 contains micro size (typically less than 0.04") through-holes that are spatially and ionically isolated from each other and do not form interconnecting channels within the body of ionically resistive element, in many but not all implementations. Such through-holes are often referred to as non-communicating through-holes. They typically extend in one dimension, often, but not necessarily, normal to the plated surface of the wafer (in some embodiments the non-communicating holes are at an angle with respect to the wafer which is generally parallel to the ionically resistive element front surface). Often the through-holes are parallel to one another. Often the holes are arranged in a square array. Other times the layout is in an offset spiral pattern. These through-holes are distinct from 3-D porous networks, where the channels extend in three dimensions and form interconnecting pore structures, because the through-holes restructure both ionic current flow and (in certain cases) fluid flow parallel to the surface therein, and straighten the path of both current and fluid flow towards the wafer surface. However, in certain embodiments, such a porous plate, having an interconnected network of pores, may be used as the ionically resistive element. When the distance from the plate's top surface to the wafer is small (e.g., a gap of about 1/10 the size of the wafer radius, for example less than about 5 mm), divergence of both current flow and fluid flow is locally restricted, imparted and aligned with the ionically resistive element channels.

One example ionically resistive element 1107 is a disc made of a solid, non-porous dielectric material that is ionically and electrically resistive. The material is also chemically stable in the plating solution of use. In certain cases the ionically resistive element 1107 is made of a ceramic material (e.g., aluminum oxide, stannic oxide, titanium oxide, or mixtures of metal oxides) or a plastic material (e.g., polyethylene, polypropylene, polyvinylidene difluoride (PVDF), polytetrafluoroethylene, polysulphone, polyvinyl chloride (PVC), polycarbonate, and the like), having between about 6,000-12,000 non-communicating through-holes. The ionically resistive element 1107, in many embodiments, is substantially coextensive with the wafer (e.g., the ionically resistive element 1107 has a diameter of about 300 mm when used with a 300 mm wafer) and resides in close proximity to the wafer, e.g., just below the wafer in a wafer-facing-down electroplating apparatus. Preferably, the plated surface of the wafer resides within about 10 mm, more preferably within about 5 mm of the closest ionically resistive element surface. To this end, the top surface of the ionically resistive element 1107 may be flat or substantially flat. Often, both the top and bottom surfaces of the ionically resistive element 1107 are flat or substantially flat. In a number of embodiments, however, the top surface of the ionically resistive element 1107 includes a series of linear ribs, as described further below.

As above, the overall ionic and flow resistance of the plate 1107 is dependent on the thickness of the plate and both the overall porosity (fraction of area available for flow through the plate) and the size/diameter of the holes. Plates of lower porosities will have higher impinging flow velocities and ionic resistances. Comparing plates of the same porosity, one having smaller diameter 1-D holes (and therefore a larger number of 1-D holes) will have a more micro-uniform distribution of current on the wafer because there are more individual current sources, which act more as point sources that can spread over the same gap, and will also have a higher total pressure drop (high viscous flow resistance).

In some cases, about 1-10% of the ionically resistive element 1107 is open area through which ionic current can pass (and through which electrolyte can pass if there is no other element blocking the openings). In particular embodiments, about 2-5% the ionically resistive element 1107 is open area. In a specific example, the open area of the ionically resistive element 1107 is about 3.2% and the effective total open cross sectional area is about 23 cm². In some embodiments, non-communicating holes formed in the ionically resistive element 1107 have a diameter of about 0.01 to 0.08 inches. In some cases, the holes have a diameter of about 0.02 to 0.03 inches, or between about 0.03-0.06 inches. In various embodiments the holes have a diameter that is at most about 0.2 times the gap distance between the ionically resistive element 1107 and the wafer. The holes are generally circular in cross section, but need not be. Further, to ease construction, all holes in the ionically resistive element 1107 may have the same diameter. However this need not be the case, and both the individual size and local density of holes may vary over the ionically resistive element surface as specific requirements may dictate.

The ionically resistive element 1107 shown in FIG. 11 includes a series of linear ribs 1115 that extend into/out of the page. The ribs 1115 are sometimes referred to as protuberances. The ribs 1115 are positioned on the top surface of the ionically resistive element 1107, and in many cases they are oriented such that their length (e.g., their longest dimension) is perpendicular to the direction of cross flowing electrolyte. In a particular embodiment, the ribs 1115 may be oriented such that their length is parallel to the direction of cross flowing electrolyte. The ribs 1115 affect the fluid flow and current distribution within the cross flow manifold 1110. For instance, the cross flow of electrolyte is largely confined to the area above the top surface of the ribs 1115, creating a high rate of electrolyte cross flow in this area. In the regions between adjacent ribs 1115, current delivered upward through the ionically resistive element 1107 is redistributed, becoming more uniform, before it is delivered to the substrate surface.

In FIG. 11, the direction of cross flowing electrolyte is left-to-right (e.g., from the side inlet 1113 to the side outlet 1114), and the ribs 1115 are oriented such that their lengths extend into/out of the page. In certain embodiments, the ribs 1115 may have a width (measured left-to-right in FIG. 11) between about 0.5 mm-1.5 mm, or between about 0.25 mm-10 mm. The ribs 1115 may have a height (measured up-down in FIG. 11) between about 1.5 mm-3.0 mm, or between about 0.25 mm-7.0 mm. The ribs 1115 may have a height to width aspect ratio (height/width) between about 5/1-2/1, or between about 7/1-1/7. The ribs 1115 may have a pitch between about 10 mm-30 mm, or between about 5 mm-150 mm. The ribs 1115 may have variable lengths (measured into/out of the page in FIG. 11) that extend across the face of the ionically resistive element 1107. The distance between the upper surface of the ribs 1115 and the surface of the substrate 1102 may be between about 1 mm-4 mm, or between about 0.5 mm-15 mm. The ribs 1115 may be provided over an area that is about coextensive with the substrate, as shown in FIG. 11. The channels/openings in the ionically resistive element 1107 may be positioned between adjacent ribs 1115, or they may extend through the ribs 1115 (in other words, the ribs 1115 may or may not be channeled). In some other embodiments, the ionically resistive element 1107 may have an upper surface that is flat (e.g., does not include the ribs 1115). The electroplating apparatus shown in FIG. 11, including the ionically resistive element with ribs thereon, is further discussed in U.S. Pat. No. 9,523,155, titled "ENHANCEMENT OF ELECTROLYTE HYDRODYNAMICS FOR EFFICIENT MASS TRANSFER DURING ELECTROPLATING," which is herein incorporated by reference in its entirety.

The apparatus may include various additional elements as needed for a particular application. In some cases, an edge flow element may be provided proximate the periphery of the substrate, within the cross flow manifold. The edge flow element may be shaped and positioned to promote a high degree of electrolyte flow (e.g., cross flow) near the edges of the substrate. The edge flow element may be ring-shaped or arc-shaped in certain embodiments, and may be azimuthally uniform or non-uniform. Edge flow elements are further discussed in U.S. patent application Ser. No. 14/924,124, filed Oct. 27, 2015, and titled "EDGE FLOW ELEMENT FOR ELECTROPLATING APPARATUS," which is herein incorporated by reference in its entirety.

In some cases, the apparatus may include a sealing member for temporarily sealing the cross flow manifold. The sealing member may be ring-shaped or arc-shaped, and may be positioned proximate the edges of the cross flow manifold. A ring-shaped sealing member may seal the entire cross flow manifold, while an arc-shaped sealing member may seal a portion of the cross flow manifold (in some cases leaving the side outlet open). During electroplating, the sealing member may be repeatedly engaged and disengaged to seal and unseal the cross flow manifold. The sealing member may be engaged and disengaged by moving the substrate holder, ionically resistive element, front side insert, or other portion of the apparatus that engages with the sealing member. Sealing members and methods of modulating cross flow are further discussed in the following U.S. Patent Applications, each of which is herein incorporated by reference in its entirety: U.S. patent application Ser. No. 15/225,716, filed Aug. 1, 2016, and titled "DYNAMIC MODULATION OF CROSS FLOW MANIFOLD DURING ELECTROPLATING"; and U.S. patent application Ser. No. 15/161,081, filed May 20, 2016, and titled "DYNAMIC MODULATION OF CROSS FLOW MANIFOLD DURING ELECTROPLATING."

In various embodiments, one or more electrolyte jet may be provided to deliver additional electrolyte above the ionically resistive element. The electrolyte jet may deliver electrolyte proximate a periphery of the substrate, or at a location that is closer to the center of the substrate, or both. The electrolyte jet may be oriented in any position, and may deliver cross flowing electrolyte, impinging electrolyte, or a combination thereof. Electrolyte jets are further described in U.S. patent application Ser. No. 15/455,011, filed Mar. 9, 2017, and titled "ELECTROPLATING APPARATUS AND METHODS UTILIZING INDEPENDENT CONTROL OF IMPINGING ELECTROLYTE," which is herein incorporated by reference in its entirety.

CONCLUSION

Although the foregoing embodiments have been described in some detail for purposes of clarity of understanding, it will be apparent that certain changes and modifications may be practiced within the scope of the appended claims. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of electroplating metal, the method comprising:
contacting a substrate with an electroplating solution having ions of a metal, wherein the substrate has features providing an open area of at least 0.9% on a face of the substrate;
applying an electrofill current waveform to the substrate contacting the electroplating solution, wherein the electrofill current waveform comprises (i) a pulse having a magnitude of at least 2 times a magnitude of a baseline current fora duration of from 10 to 200 seconds, wherein the pulse of the electrofill current waveform comprises an initial step change that increases the magnitude of current applied to the substrate, followed by a ramp that decreases the magnitude of current applied to the substrate, wherein the duration of the ramp is at least 10 seconds, and (ii) a constant current step having, on average, the magnitude of the baseline current, wherein the constant current step follows the pulse; and
filling at least a portion of the features with the metal.

2. The method of claim 1, wherein the ramp is a linear change between the magnitude of the pulse current and the magnitude of the baseline current.

3. The method of claim 1, wherein the electrofill current waveform further comprises (iii) a second constant current step having, on average, a magnitude that is greater than the magnitude of the baseline current.

4. The method of claim 1, wherein the electrofill current waveform further comprises (iv) one or more additional constant current steps, each having, on average, a magnitude that is greater than the magnitude of the baseline current.

5. The method of claim 1, wherein the electrofill current waveform further comprises an induction phase preceding the pulse, wherein during the induction phase no current is applied to the substrate or an induction phase current is applied to the substrate, wherein the induction phase current has an average magnitude of between 30 mA and 200 mA.

6. The method of claim 1, wherein, when applied to the substrate, the baseline current produces a current density of between 0.1 and 10 mA/cm$^2$ on the substrate.

7. The method of claim 1, wherein the substrate is a semiconductor wafer having integrated circuits at least partially fabricated thereon.

8. The method of claim 1, wherein the substrate is a 300 mm semiconductor wafer.

9. The method of claim 1, wherein the features on the substrate are through silicon vias.

10. The method of claim 9, wherein the through silicon vias have, on average, an opening width or diameter on the substrate face of at least 0.1 micrometers.

11. The method of claim 9, wherein the through silicon vias have, on average, a depth of at least 10 micrometers.

12. The method of claim 9, wherein the through silicon vias have, on average, an aspect ratio of 4 or greater.

13. The method of claim 1, wherein the metal is copper.

14. The method of claim 1, wherein the electroplating solution comprises a source of cupric ions.

15. The method of claim 1, wherein the electroplating solution does not contain a source of cuprous ions.

16. The method of claim 1, wherein the electroplating solution has a pH of 0 to 1.

17. The method of claim 1, wherein the electroplating solution comprises an accelerator and a suppressor.

18. The method of claim 17, wherein the accelerator is SPS.

19. A method of electroplating metal, the method comprising:
contacting a substrate with an electroplating solution having ions of a metal, wherein the substrate has features;
applying an electrofill current waveform to the substrate contacting the electroplating solution, wherein the electrofill current waveform comprises (i) a pulse having a magnitude of at least 2 times a magnitude of a baseline current for a duration of from 10 to 200 seconds, wherein the pulse of the electrofill current waveform comprises an initial step change that increases the magnitude of current applied to the substrate, followed by a ramp that decreases the magnitude of current applied to the substrate, wherein the duration of the ramp is at least 10 seconds, and (ii) a constant current step having, on average, the magnitude of the baseline current, wherein the constant current step follows the pulse; and filling at least a portion of the features with the metal.

20. An electroplating system for electroplating metal, the system comprising:

an electroplating cell configured to contain an anode and an electroplating solution having ions of a metal;

a wafer holder configured to support a substrate within the electroplating cell; and one or more controllers configured to cause:

contacting the substrate with the electroplating solution having ions of a metal, wherein the substrate has features;

applying an electrofill current waveform to the substrate contacting the electroplating solution, wherein the electrofill current waveform comprises (i) a pulse having a magnitude of at least 2 times a magnitude of a baseline current for a duration of from 10 to 200 seconds, wherein the pulse of the electrofill current waveform comprises an initial step change that increases the magnitude of current applied to the substrate, followed by a ramp that decreases the magnitude of current applied to the substrate, wherein the duration of the ramp is at least 10 seconds, and (ii) a constant current step having, on average, the magnitude of the baseline current, wherein the constant current step follows the pulse; and filling at least a portion of the features with the metal.

21. The system of claim 20, wherein the ramp is a linear change between the magnitude of the pulse current and the magnitude of the baseline current.

22. The system of claim 20, wherein the electrofill current waveform further comprises (iii) a second constant current step having, on average, a magnitude that is greater than the magnitude of the baseline current.

23. The system of claim 20, wherein the electrofill current waveform further comprises (iv) one or more additional constant current steps, each having, on average, a magnitude that is greater than the magnitude of the baseline current.

24. The system of claim 20, wherein the electrofill current waveform further comprises an induction phase preceding the pulse, wherein during the induction phase no current is applied to the substrate or an induction phase current is applied to the substrate, wherein the induction phase current has an average magnitude of between 30 mA and 200 mA.

25. The system of claim 20, wherein, when applied to the substrate, the baseline current produces a current density of between about 0.1 and 10 $mA/cm^2$ on the substrate.

26. The system of claim 20, wherein the substrate is a semiconductor wafer having integrated circuits at least partially fabricated thereon.

27. The system of claim 20, wherein the features on the substrate are through silicon vias.

28. The system of claim 27, wherein the through silicon vias have, on average, an opening width or diameter on the substrate face of at least 0.1 micrometers.

29. The system of claim 27, wherein the through silicon vias have, on average, a depth of at least 10 micrometers.

30. The system of claim 27, wherein the through silicon vias have, on average, an aspect ratio of 4 or greater.

31. The system of claim 20, wherein the metal is copper.

32. The system of claim 20, wherein the electroplating solution comprises a source of cupric ions.

33. The system of claim 20, wherein the electroplating solution does not contain a source of cuprous ions.

34. The system of claim 20, wherein the electroplating solution has a pH of 0 to 1.

* * * * *